(12) United States Patent
Shin et al.

(10) Patent No.: US 11,852,971 B2
(45) Date of Patent: Dec. 26, 2023

(54) COMPOUND, PHOTOSENSITIVE RESIN COMPOSITION INCLUDING THE SAME, PHOTOSENSITIVE RESIN LAYER, COLOR FILTER AND DISPLAY DEVICE

(71) Applicant: SAMSUNG SDI CO., LTD., Yongin-si (KR)

(72) Inventors: Myoungyoup Shin, Suwon-si (KR); Sooyoung Heo, Suwon-si (KR); Jihye Kwon, Suwon-si (KR); Jonghee Park, Suwon-si (KR); Chang-Hyun Kwon, Suwon-si (KR); Jeehyun Ryu, Suwon-si (KR); Euisoo Jeong, Suwon-si (KR); Juho Jung, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 348 days.

(21) Appl. No.: 17/082,384

(22) Filed: Oct. 28, 2020

(65) Prior Publication Data
US 2021/0124264 A1 Apr. 29, 2021

(30) Foreign Application Priority Data

Oct. 29, 2019 (KR) .................... 10-2019-0135770
Aug. 19, 2020 (KR) .................... 10-2020-0104060

(51) Int. Cl.
*G03F 7/004* (2006.01)
*C09B 47/10* (2006.01)
*G02B 5/22* (2006.01)
*G03F 7/00* (2006.01)
*C09B 47/18* (2006.01)

(52) U.S. Cl.
CPC ............ *G03F 7/0045* (2013.01); *C09B 47/10* (2013.01); *C09B 47/18* (2013.01); *G02B 5/223* (2013.01); *G03F 7/0007* (2013.01)

(58) Field of Classification Search
CPC .................................. C09B 47/10; C09B 47/18
See application file for complete search history.

(56) References Cited

U.S. PATENT DOCUMENTS

| 10,564,320 B2 * | 2/2020 | Jeong ................ C09B 47/04 |
| 2019/0375914 A1 * | 12/2019 | Samejima ........... C08F 220/365 |
| 2020/0142301 A1 * | 5/2020 | Kwon ................ C09B 67/0034 |

FOREIGN PATENT DOCUMENTS

| CN | 108107650 A | 6/2018 | |
| EP | 619345 A1 * | 10/1994 | ............. C09B 47/18 |

(Continued)

OTHER PUBLICATIONS

Machine Translation of JP 2014/028950 (no date).*

(Continued)

*Primary Examiner* — Amanda C. Walke
(74) *Attorney, Agent, or Firm* — Lee IP Law, P.C.

(57) ABSTRACT

A phthalocyanine compound a photosensitive resin composition including the same, a photosensitive resin layer produced using the photosensitive resin composition, a color filter including the photosensitive resin layer, and a display device including the color filter, the phthalocyanine compound exhibiting a shortest wavelength of a full width at half maximum (FWHM) with respect to a maximum absorption wavelength in a range of about 600 nm to about 620 nm.

18 Claims, 1 Drawing Sheet

(56) References Cited

FOREIGN PATENT DOCUMENTS

| JP | 53111330 | A | * | 9/1978 | |
| --- | --- | --- | --- | --- | --- |
| JP | 01217362 | A | * | 8/1989 | ............ G03G 5/0696 |
| JP | H02-199403 | A | | 8/1990 | |
| JP | H04-76062 | A | | 3/1992 | |
| JP | H05-273411 | A | | 10/1993 | |
| JP | H06-041458 | | | 2/1994 | |
| JP | H06-184482 | A | | 7/1994 | |
| JP | H07-140654 | A | | 6/1995 | |
| JP | H10-254133 | A | | 9/1998 | |
| JP | 2000-302933 | A | | 10/2000 | |
| JP | 2002-278056 | A | | 9/2002 | |
| JP | 2005290259 | A | * | 10/2005 | |
| JP | 2009-081309 | A | | 4/2009 | |
| JP | 2012255510 | A | * | 12/2012 | |
| JP | 2013-182214 | A | | 9/2013 | |
| JP | 2014-028950 | A | | 2/2014 | |
| JP | 2014028950 | A | * | 2/2014 | |
| JP | 2015-040214 | A | | 3/2015 | |
| JP | 2015-40214 | A | | 3/2015 | |
| JP | 6324758 | B2 | * | 5/2018 | |
| KR | 10-2009-0106226 | A | | 10/2009 | |
| KR | 10-2010-0078845 | A | | 7/2010 | |
| KR | 10-1304266 | B1 | | 9/2013 | |
| KR | 10-2017-0024840 | A | | 3/2017 | |
| KR | 10-2017-0048931 | A | | 5/2017 | |
| KR | 10-2019-0013136 | A | | 2/2019 | |
| KR | 10-2019-0082591 | A | | 7/2019 | |
| TW | 201303499 | A1 | | 1/2013 | |

OTHER PUBLICATIONS

Sharman et al, Synthesis and Photodynamic Activity of Novel Asymmetrically Substituted Fluorinated Phthalocyanines, Bioconjugate Chemistry, 16, 1166-1175 (2005). (Year: 2005).*
Machine translation of JP 53-111330 (no date).*
Chinese Office Action and Search Report dated Feb. 9, 2023.
Wesley M. Sharman, et al., Bioconjugate Chem. 16, 2005-09-02, 1166-1175, "Synthesis and Photodynamic Activity of Novel Asymmetrically Substituted Fluorinated Phthalocyanines".
Chinese Search Report dated Aug. 18, 2023 of the corresponding Chinese Patent Application No. 202011170430.X.

* cited by examiner

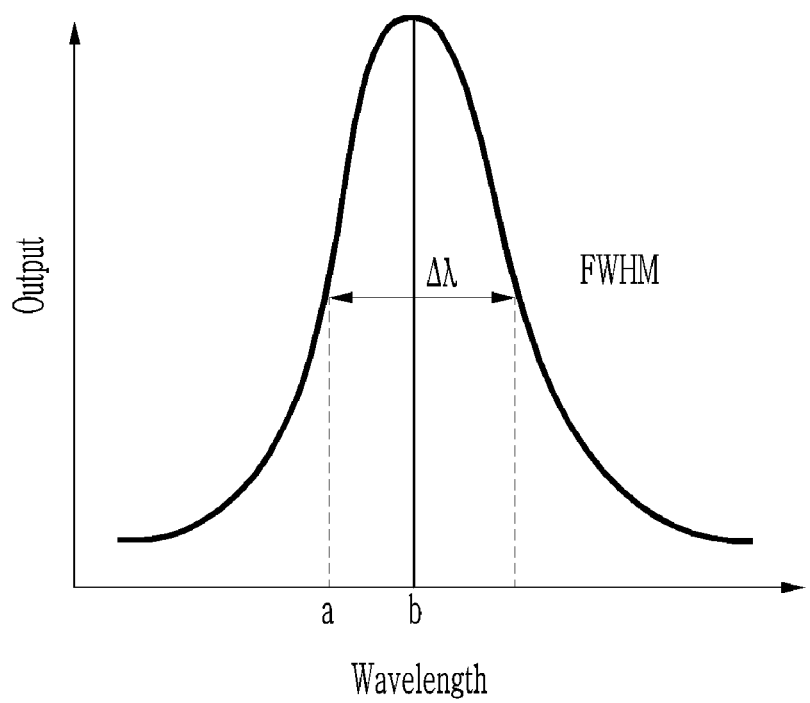

COMPOUND, PHOTOSENSITIVE RESIN COMPOSITION INCLUDING THE SAME, PHOTOSENSITIVE RESIN LAYER, COLOR FILTER AND DISPLAY DEVICE

CROSS-REFERENCE TO RELATED APPLICATION

Korean Patent Application No. 10-2019-0135770, filed on Oct. 29, 2019, in the Korean Intellectual Property Office, and entitled: "Compound, Photosensitive Resin Composition Comprising the Same, Photosensitive Resin Layer, Color Filter and Display Device," is incorporated by reference herein in its entirety.

BACKGROUND

1. Field

Embodiments relate to a compound, a photosensitive resin composition including the same, a photosensitive resin layer, a color filter, and a display device.

2. Description of the Related Art

A liquid crystal display device among many kinds of displays may have an advantage of lightness, thinness, low cost, low power consumption for operation, and improved adherence to an integrated circuit and has been more widely used for a laptop computer, a monitor, and a TV screen. The liquid crystal display device may include a lower substrate on which a black matrix, a color filter, and an ITO pixel electrode are formed, and an upper substrate on which an active circuit portion including a liquid crystal layer, a thin film transistor, and a capacitor layer and an ITO pixel electrode are formed. Color filters may be formed in a pixel region by sequentially stacking a plurality of color filters (e.g., formed of three primary colors such as red (R), green (G), and blue (B)) in a predetermined order to form each pixel, and a black matrix layer may be disposed in a predetermined pattern on a transparent substrate to form a boundary between the pixels.

SUMMARY

The embodiments may be realized by providing a phthalocyanine compound exhibiting a shortest wavelength of a full width at half maximum (FWHM) with respect to a maximum absorption wavelength in a range of about 600 nm to about 620 nm.

The phthalocyanine compound may be represented by Chemical Formula 1:

[Chemical Formula 1]

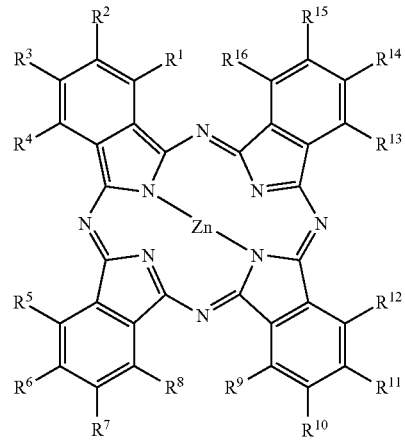

in Chemical Formula 1, $R^1$ to $R^4$ may be each a hydrogen atom, $R^5$ to $R^8$ may be each independently a hydrogen atom or a halogen atom, and $R^9$ to $R^{16}$ may be each independently a halogen atom or a group represented by Chemical Formula 2,

 [Chemical Formula 2]

in Chemical Formula 2, $R^{17}$ may be a substituted or unsubstituted C1 to C20 alkyl group or a substituted or unsubstituted C6 to C20 aryl group.

At least one of $R^9$ to $R^{16}$ may be a group represented by Chemical Formula 2, the group represented by Chemical Formula 2 may be represented by one of Chemical Formula 2-1 to Chemical Formula 2-4:

[Chemical Formula 2-1]

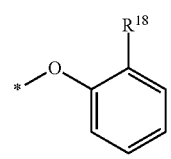

[Chemical Formula 2-2]

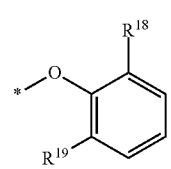

[Chemical Formula 2-3]

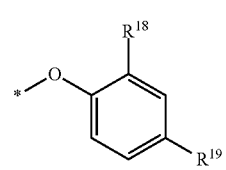

[Chemical Formula 2-4]

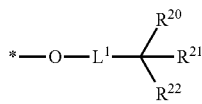

in Chemical Formula 2-1 to Chemical Formula 2-4, $R^{18}$ and $R^{19}$ may be each independently a substituted or unsubstituted C1 to C20 alkyl group, $R^{20}$ to $R^{22}$ may be each independently a hydrogen atom or a substituted or unsubstituted C1 to C20 alkyl group, and $L^1$ may be a substituted or unsubstituted C1 to C20 alkylene group.

At least one of $R^9$ to $R^{16}$ may be a group represented by Chemical Formula 2.

One of $R^9$ to $R^{16}$ may be a group represented by Chemical Formula 2 and remaining ones of $R^9$ to $R^{16}$ may be a halogen atom.

One of $R^9$ to $R^{12}$ may be a group represented by Chemical Formula 2 and remaining ones of $R^9$ to $R^{16}$ may be a halogen atom, or one of $R^{13}$ to $R^{16}$ may be a group represented by Chemical Formula 2 and remaining ones of $R^9$ to $R^{16}$ may be a halogen atom.

One of $R^{10}$, $R^{11}$, $R^{14}$, and $R^{15}$ may be a group represented by Chemical Formula 2 and remaining ones of $R^9$ to $R^{16}$ may be a halogen atom.

Two of $R^9$ to $R^{16}$ may be groups represented by Chemical Formula 2 and remaining ones of $R^9$ to $R^{16}$ may be a halogen atom.

One of $R^9$ to $R^{12}$ may be a group represented by Chemical Formula 2 and remaining ones of $R^9$ to $R^{12}$ may be a halogen atom, and one of $R^{13}$ to $R^{16}$ may be a group represented by Chemical Formula 2 and remaining ones of $R^{13}$ to $R^{16}$ may be a halogen atom.

One of $R^{10}$ and $R^{11}$ may be a group represented by Chemical Formula 2 and remaining ones of $R^9$ to $R^{12}$ may be a halogen atom, and one of $R^{14}$ and $R^{15}$ may be a group represented by Chemical Formula 2 and remaining ones of $R^{13}$ to $R^{16}$ may be a halogen atom.

The compound represented by Chemical Formula 1 may be a compound represented by one of Chemical Formula 1-1 to Chemical Formula 1-20:

[Chemical Formula 1-1]

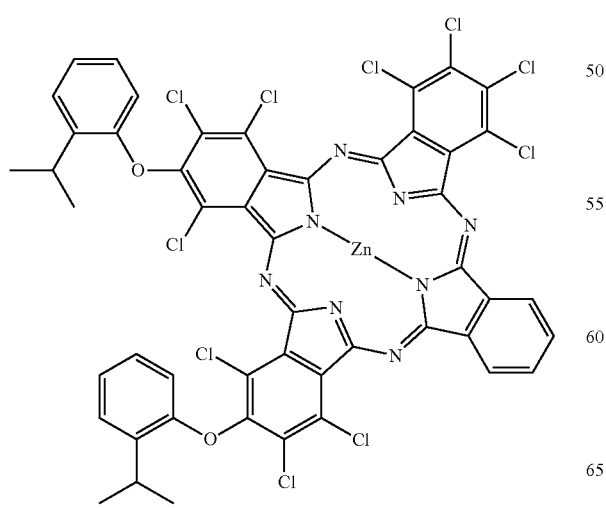

[Chemical Formula 1-2]

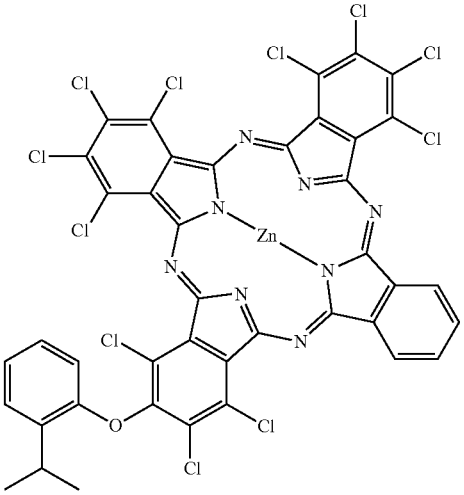

[Chemical Formula 1-3]

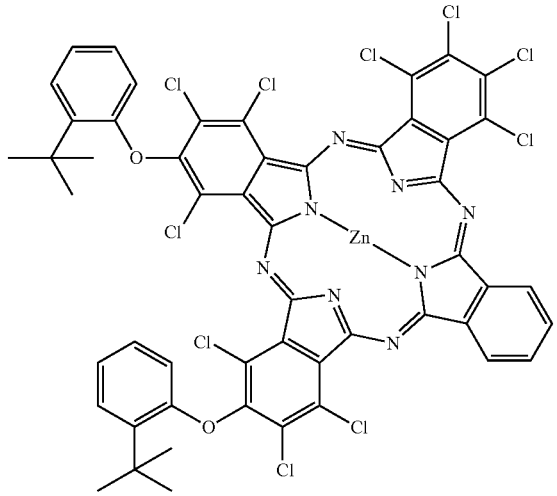

[Chemical Formula 1-4]

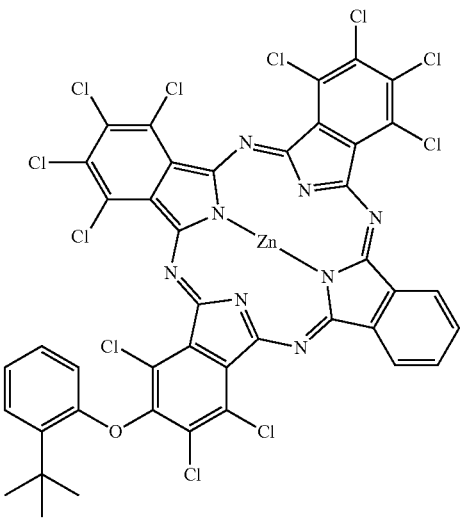

[Chemical Formula 1-5]
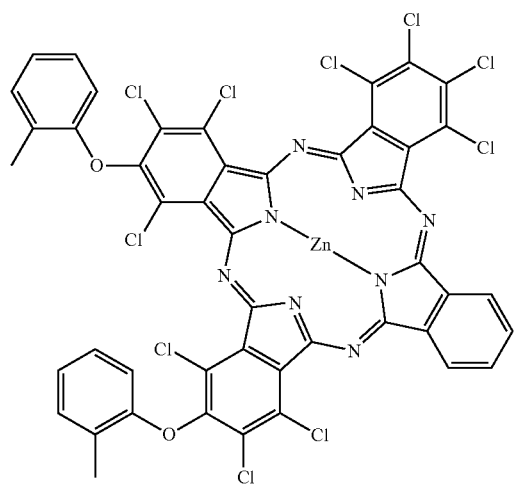
[Chemical Formula 1-6]
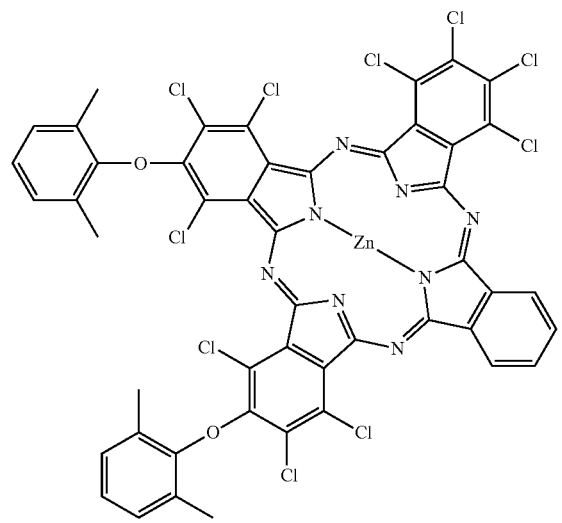
[Chemical Formula 7]
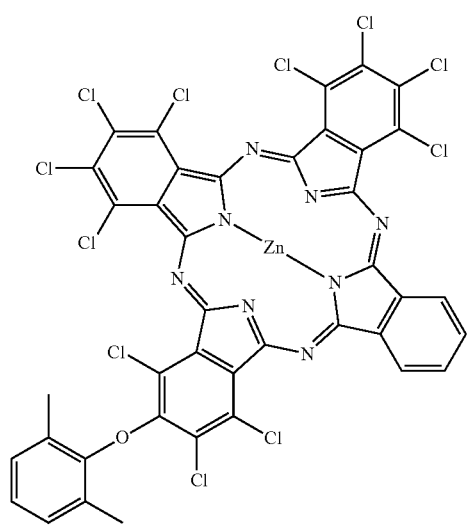
[Chemical Formula 8]
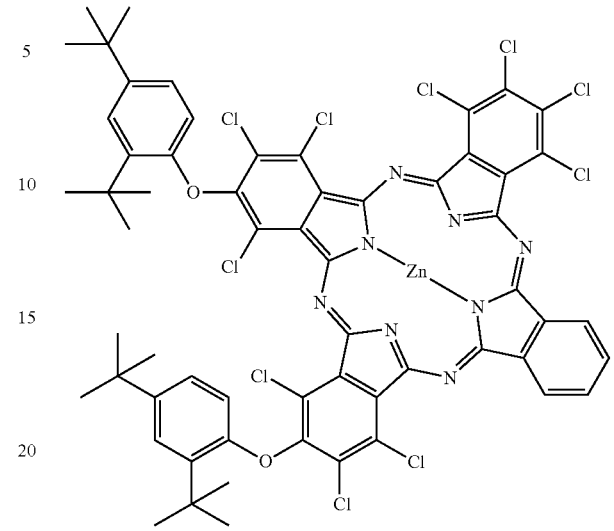
[Chemical Formula 9]
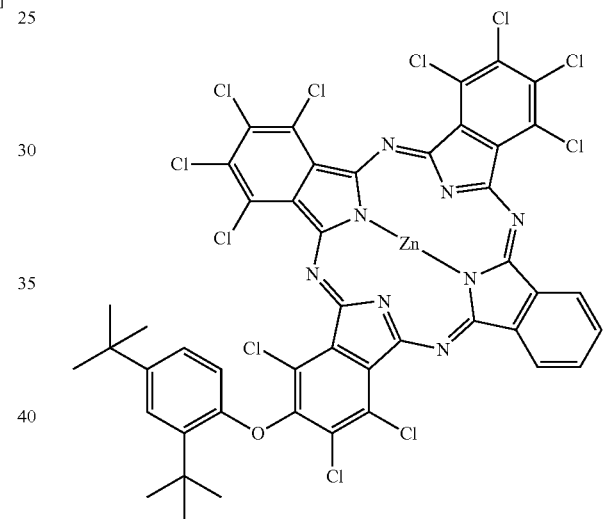
[Chemical Formula 10]
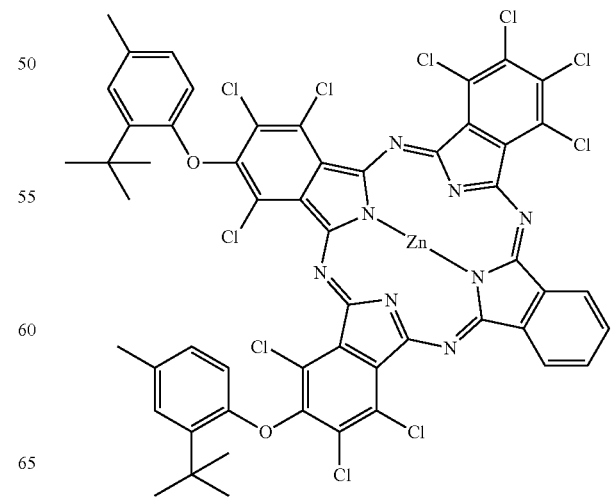

[Chemical Formula 11]
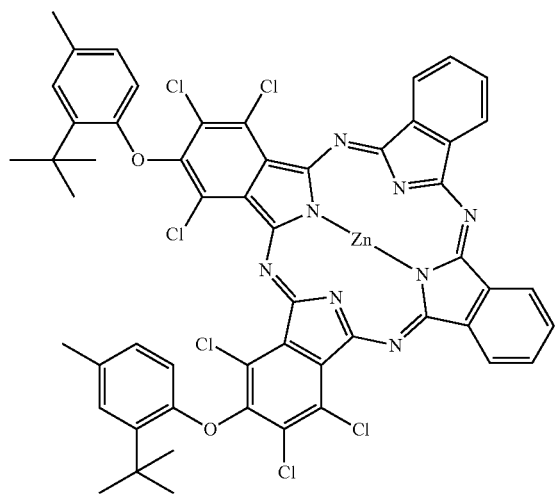
[Chemical Formula 12]
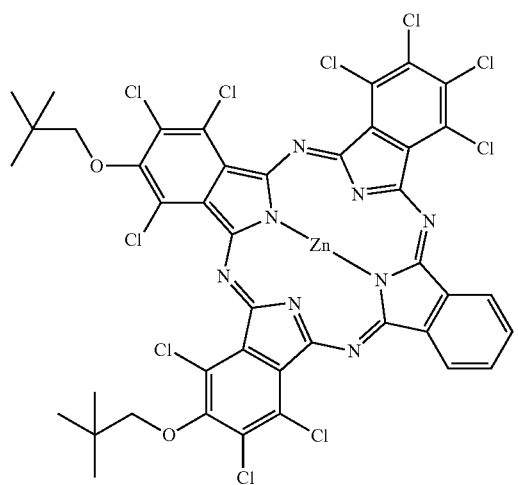
[Chemical Formula 1-13]
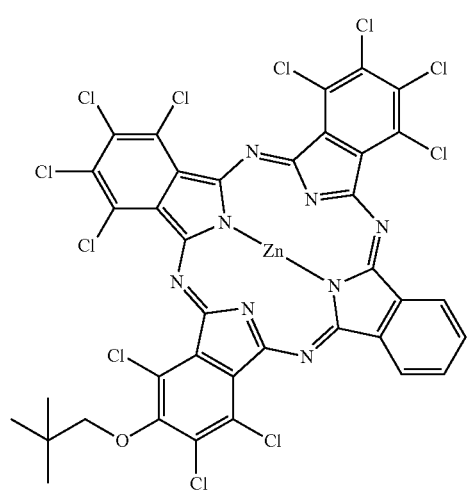
[Chemical Formula 1-14]
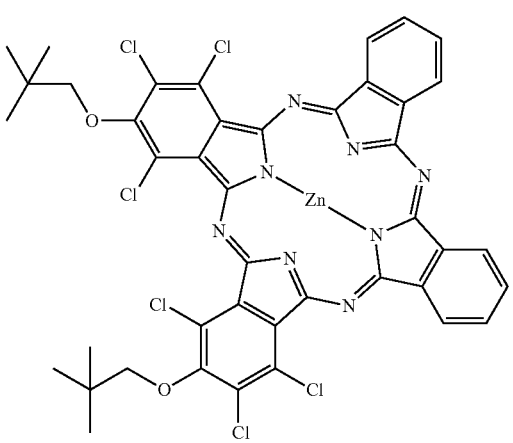
[Chemical Formula 1-15]
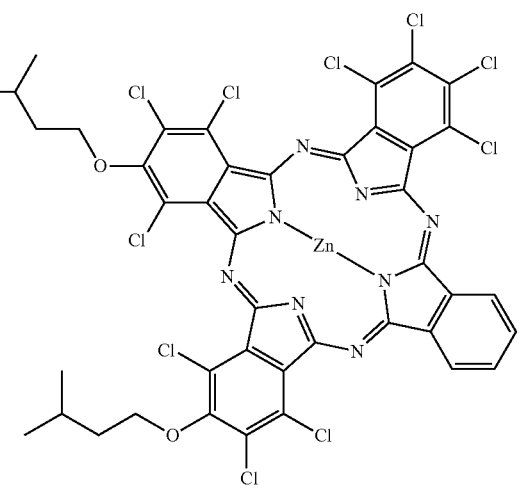
[Chemical Formula 1-16]
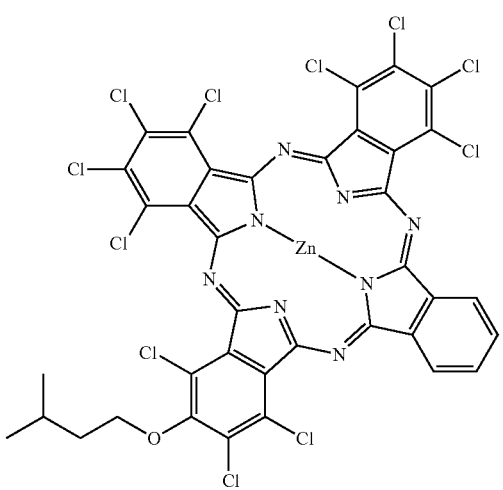

[Chemical Formula 1-17]

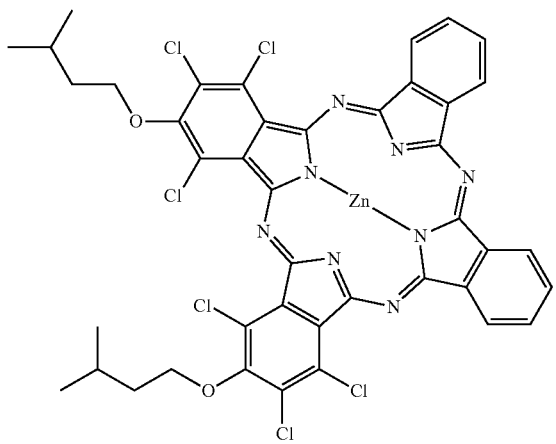

[Chemical Formula 1-18]

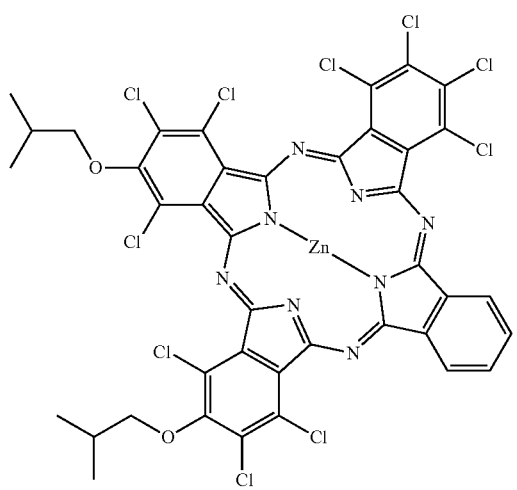

[Chemical Formula 1-19]

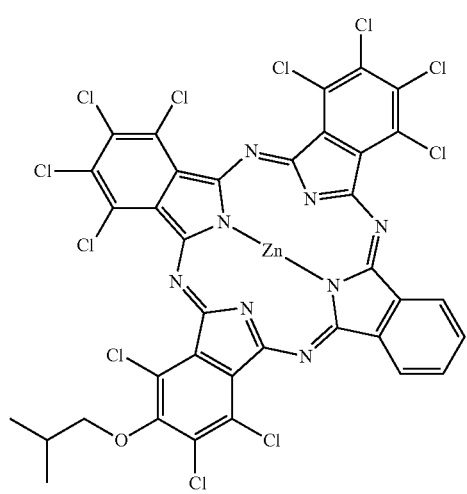

[Chemical Formula 1-20]

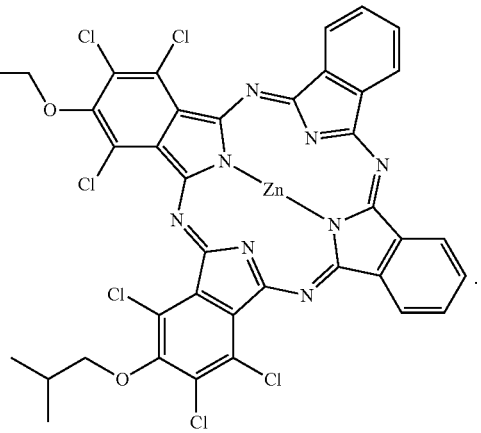

The compound may be a green dye.

The embodiments may be realized by providing a photosensitive resin composition comprising the compound according to an embodiment.

The compound may be included in an amount of about 1 wt % to about 40 wt %, based on a total weight of the photosensitive resin composition.

The photosensitive resin composition may further include a binder resin, a photopolymerizable compound, a photopolymerization initiator, and a solvent.

The photosensitive resin composition may further include a pigment.

The photosensitive resin composition may further include a compound represented by Chemical Formula 3:

[Chemical Formula 3]

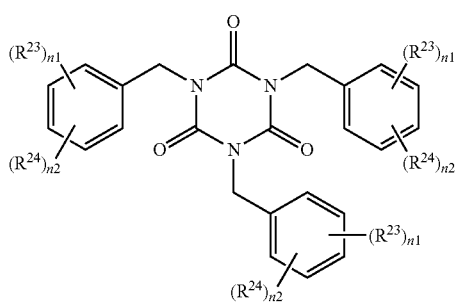

wherein, in Chemical Formula 3, $R^{23}$ and $R^{24}$ may be each independently a hydroxy group or a substituted or unsubstituted C1 to C20 alkyl group, and n1 and n2 may be each independently an integer of 0 to 5, provided that $3 \leq n1+n2 \leq 5$.

The embodiments may be realized by providing a photosensitive resin layer produced using the photosensitive resin composition according to an embodiment.

The embodiments may be realized by providing a color filter comprising the photosensitive resin layer according to an embodiment.

The embodiments may be realized by providing a display device comprising the color filter according to an embodiment.

BRIEF DESCRIPTION OF THE DRAWING

Features will become apparent to those of skill in the art by describing in detail exemplary embodiments with reference to the attached drawing in which:

The FIGURE is a view of a full width at half maximum (FWHM) with respect to a maximum absorption wavelength and a shortest wavelength of the FWHM of a compound.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present.

As used herein, when specific definition is not otherwise provided, the term "substituted" refers to one substituted with a substituent selected from a halogen (F, Br, Cl, or I), a hydroxy group, a nitro group, a cyano group, an amino group ($NH_2$, $NH(R^{200})$ or $N(R^{201})(R^{202})$, wherein $R^{200}$, $R^{201}$, and $R^{202}$ are the same or different, and are independently a C1 to C10 alkyl group), an amidino group, a hydrazine group, a hydrazone group, a carboxyl group, a substituted or unsubstituted alkyl group, a substituted or unsubstituted alkenyl group, a substituted or unsubstituted alkynyl group, a substituted or unsubstituted alicyclic organic group, a substituted or unsubstituted aryl group, and a substituted or unsubstituted heterocyclic group.

As used herein, when specific definition is not otherwise provided, the term "alkyl group" refers to a C1 to C20 alkyl group, and specifically a C1 to C15 alkyl group, the term "cycloalkyl group" refers to a C3 to C20 cycloalkyl group, and specifically a C3 to C18 cycloalkyl group, the term "alkoxy group" refers to a C1 to C20 alkoxy group, and specifically a C1 to C18 alkoxy group, the term "aryl group" refers to a C6 to C20 aryl group, and specifically a C6 to C18 aryl group, the term "alkenyl group" refers to a C2 to C20 alkenyl group, and specifically a C2 to C18 alkenyl group, the term "alkylene group" refers to a C1 to C20 alkylene group, and specifically C1 to C18 alkylene group, and the term "arylene group" refers to a C6 to C20 arylene group, and specifically a C6 to C16 arylene group.

As used herein, when specific definition is not otherwise provided, "(meth)acrylate" refers to "acrylate" and "methacrylate" and "(meth)acrylic acid" refers to "acrylic acid" and "methacrylic acid."

As used herein, when a definition is not otherwise provided, the term "combination" refers to mixing or copolymerization. In addition, "copolymerization" refers to block copolymerization to random copolymerization, and "copolymer" refers to a block copolymer to a random copolymer.

In the chemical formula of the present specification, unless a specific definition is otherwise provided, hydrogen is bonded at the position when a chemical bond is not drawn where supposed to be given.

As used herein, when specific definition is not otherwise provided, "*" indicates a point where the same or different atom or chemical formula is linked.

An embodiment provides a phthalocyanine compound exhibiting a shortest wavelength of the FWHM with respect to the maximum absorption wavelength in a range of about 600 nm to about 620 nm.

A color filter formed of a photosensitive resin composition using a pigment as a colorant may have a limit in terms of luminance and a contrast ratio due to particle sizes of the pigment, and it may be desirable to improve the luminance and the contrast ratio. Accordingly, efforts to prepare a photosensitive resin composition appropriate for a dye by introducing the dye not forming particles instead of the pigment and thus implement a color filter with improved luminance and contrast ratio have been considered and as a result, the photosensitive resin composition using the dye instead of the pigment as a main colorant has some effects on improving the luminance and the contrast ratio.

The demand for photosensitive resin compositions applicable to charge coupled devices (CCD), complementary metal-oxide semiconductor image sensor, or the like in addition to other display devices such as LCD have recently been rapidly increasing. A photosensitive resin composition using a dye as a main colorant may not realize high colors when applied to the image sensors and hardly provide a high definition color filter. The reason of not realizing the high colors is that color filters mounted on the charge coupled device (CCD) may have about 1/100 times to about 1/200 times smaller pattern size than those of the color filters for LCD.

An embodiment may provide a dye compound used in a photosensitive resin composition for a color filter capable of realizing high colors by limiting the shortest wavelength of a full width at half maximum (FWHM) of a phthalocyanine compound with respect to each maximum absorption wavelength within the particular wavelength range, so that the compound may be easily applied to patterns having about 100 times to about 200 times smaller size than color filter patterns for LCD to increase resolution and reduce residues.

The shortest wavelength of the full width at half maximum (FWHM) with respect to the maximum absorption wavelengths denotes a wavelength having the smallest value (a) among the energy widths (Δλ) of the maximum absorption wavelength (b) in the absorption spectrum of a particular phthalocyanine compound. (Refer to the FIGURE)

Phthalocyanine compounds having the shortest wavelength of a full width at half maximum (FWHM) with respect to a maximum absorption wavelength within the range of about 600 nm to about 620 nm, e.g., about 610 nm to about 620 nm or about 611 nm to about 616 nm may not only exhibit excellent solubility in an organic solvent, compared with phthalocyanine compounds having a shortest wavelength of a full width at half maximum (FWHM) with respect to a maximum absorption wavelength out of the described ranges, and may also improve luminance and chemical resistance of a photosensitive resin composition including the same as a colorant and above all, may realize high colors (deteriorate Gx in a CIE color coordinate (Gx, Gy)).

In an implementation, the phthalocyanine compound exhibiting the shortest wavelength of the FWHM with respect to the maximum absorption wavelength in a range of about 600 nm to about 620 nm may be represented by Chemical Formula 1.

[Chemical Formula 1]

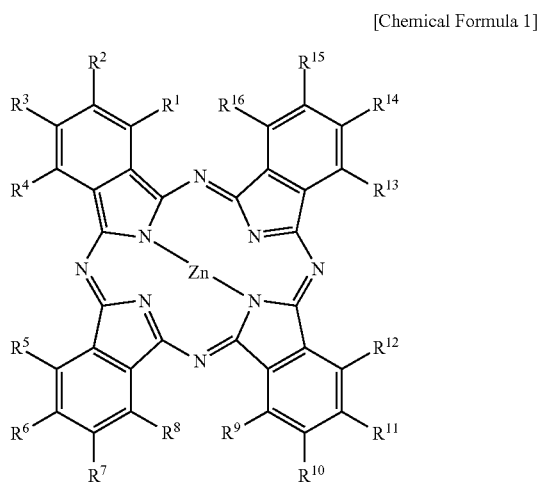

[Chemical Formula 2-1]
[Chemical Formula 2-2]
[Chemical Formula 2-3]
[Chemical Formula 2-4]

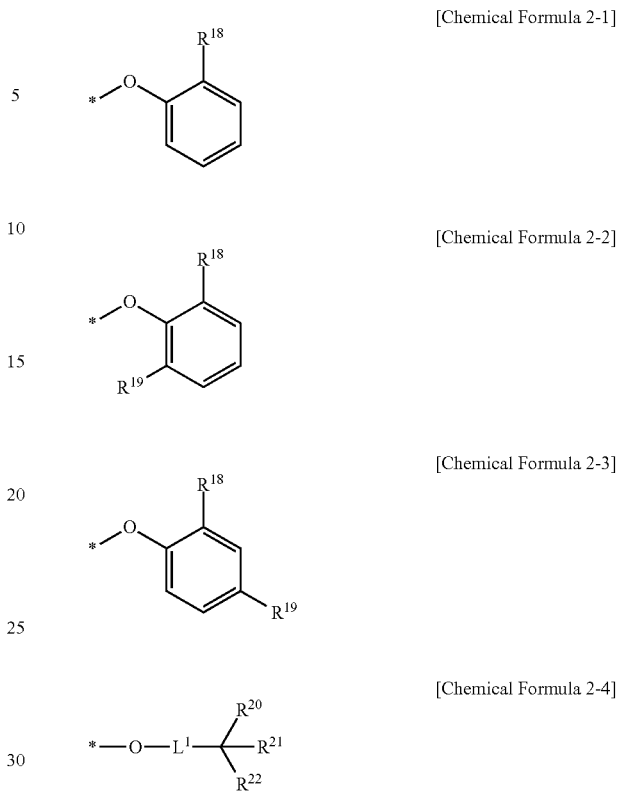

In Chemical Formula 1, $R^1$ to $R^4$ may each be, e.g., a hydrogen atom, $R^5$ to $R^8$ may each independently be, e.g., a hydrogen atom or a halogen atom, and $R^9$ to $R^{16}$ may each independently be, e.g., a halogen atom or a group represented by Chemical Formula 2.

$$*-O-R^{17}$$ [Chemical Formula 2]

In Chemical Formula 2, $R^{17}$ may be or may include, e.g., a substituted or unsubstituted C1 to C20 alkyl group or a substituted or unsubstituted C6 to C20 aryl group.

The compound represented by Chemical Formula 1 may have excellent green spectral characteristics and a high molar extinction coefficient. In an implementation, the compound represented by Chemical Formula 1 may include at least one group or substituent represented by Chemical Formula 2, and it may exhibit excellent solubility in an organic solvent and excellent luminance and chemical resistance when applied to a color filter.

In an implementation, when the compound represented by Chemical Formula 1 does not include any substituents represented by Chemical Formula 2, a solubility for the organic solvent, luminance, and chemical resistance may be deteriorated, and it may not be desirable as a colorant in the photosensitive resin composition for a color filter and it may be very difficult to implement a high-color reproduction image sensor.

The substituent or group represented by Chemical Formula 2 may be an aryloxy group having one or two alkyl groups as a substituent or an alkoxy group having one or two alkyl groups as a substituent. In an implementation, in the substituted aryloxy group, the aryl group substituent may be substituted at the ortho or para position, and luminance and chemical resistance may be further improved. If the alkyl group substituent were to be substituted at the meta position, it could be difficult to implement a green pixel for a color filter.

In an implementation, the group represented by Chemical Formula 2 may be represented by one of Chemical Formula 2-1 to Chemical Formula 2-4.

In Chemical Formula 2-1 to Chemical Formula 2-4, $R^{18}$ and $R^{19}$ may each independently be or include, e.g., a substituted or unsubstituted C1 to C20 alkyl group, $R^{20}$ to $R^{22}$ may each independently be or include, e.g., a hydrogen atom or a substituted or unsubstituted C1 to C20 alkyl group, and $L^1$ may be or may include, e.g., a substituted or unsubstituted C1 to C20 alkylene group.

In an implementation, in Chemical Formula 2-2 and Chemical Formula 2-3, at least one of $R^{18}$ and $R^{19}$ may be a non-linear (branched) alkyl group such as a tert-butyl group, rather than a linear alkyl group such as a methyl group, an ethyl group, or an n-butyl group, and the compound may exhibit improved luminance and chemical resistance. In an implementation, in Chemical Formula 2-4, at least one of $R^{20}$ to $R^{22}$ may be a substituted or unsubstituted C1 to C20 alkyl group, and the compound may exhibit improved luminance and chemical resistance.

In an implementation, the substituent represented by Chemical Formula 2 may be represented by Chemical Formula 2-4, and developability may be further improved.

In an implementation, the phthalocyanine compound represented by Chemical Formula 1 may include four hydrogen atoms and at least 4 halogen atoms and may further improve the solubility for an organic solvent due to these structural characteristics. In an implementation, the phthalocyanine compound represented by Chemical Formula 1 may include four benzene rings of i) a benzene ring including groups $R^1$ to $R^4$ thereon, ii) a benzene ring including groups $R^5$ to $R^8$ thereon, iii) a benzene ring including groups $R^9$ to $R^{12}$ thereon, and iv) a benzene ring including groups $R^{13}$ to $R^{16}$ thereon in the core structure. The benzene ring including the substituent represented by Chemical Formula 2 among the four benzene rings may include three groups halogen atoms except for the substituent represented by Chemical Formula 2, and the benzene ring not including the substituent represented by Chemical Formula 2 may include all hydrogen atoms or halogen atoms. In an implementation, this structural characteristics thereof may easily put the shortest wavelength of a full width at half maximum (FWHM) with respect to a maximum absorption wavelength within the range of about 600 nm to about 620 nm and further improve solubility of the compound for an organic solvent and thus contribute to improving luminance and securing process characteristics.

In a phthalocyanine compound exhibiting the shortest wavelength of the FWHM with respect to the maximum absorption wavelength within the range of about 600 nm to about 620 nm and not represented by Chemical Formula 1, luminance and chemical resistance of a photosensitive resin composition including the same as a colorant may be greatly deteriorated, or high colors may not be realized. In an implementation, the phthalocyanine compound according to an embodiment may desirably exhibit the shortest wavelength of the FWHM with respect to the maximum absorption wavelength within the range of about 600 nm to about 620 nm and simultaneously, have a structure represented by Chemical Formula 1.

In an implementation, one or two of $R^9$ to $R^{16}$ may be a group represented by Chemical Formula 2. When one or two of $R^9$ to $R^{16}$ (e.g., none) are not a group represented by Chemical Formula 2, the luminance may be lowered.

In an implementation, one of $R^9$ to $R^{12}$ or one of $R^{13}$ to $R^{16}$ may be a group represented by Chemical Formula 2 (e.g., and remaining ones may be a halogen atom).

In an implementation, one of $R^{10}$, $R^{11}$, $R^{14}$, and $R^{15}$ may be a group represented by Chemical Formula 2 (e.g., and remaining ones may be a halogen atom).

In an implementation, one of $R^{10}$ and $R^{11}$ and one of $R^{14}$ and $R^{15}$ may be a group represented by Chemical Formula 2 (e.g., and remaining ones may be a halogen atom).

In an implementation, the compound represented by Chemical Formula 1 may be a compound represented by one of Chemical Formula 1-1 to Chemical Formula 1-20.

[Chemical Formula 1-1]

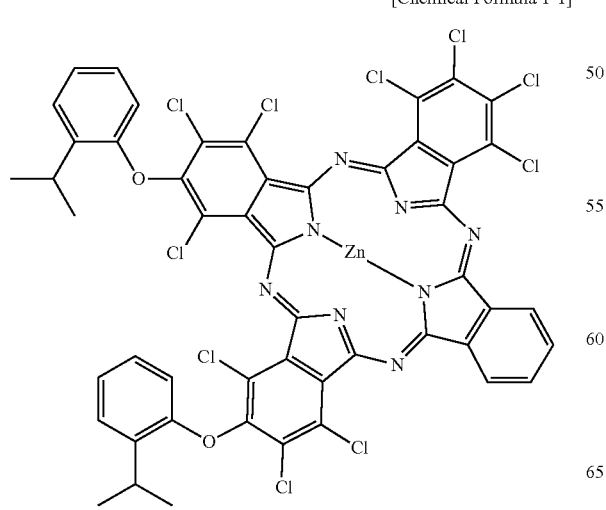

[Chemical Formula 1-2]

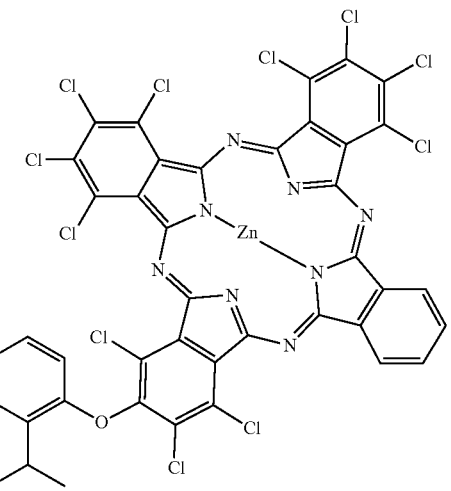

[Chemical Formula 1-3]

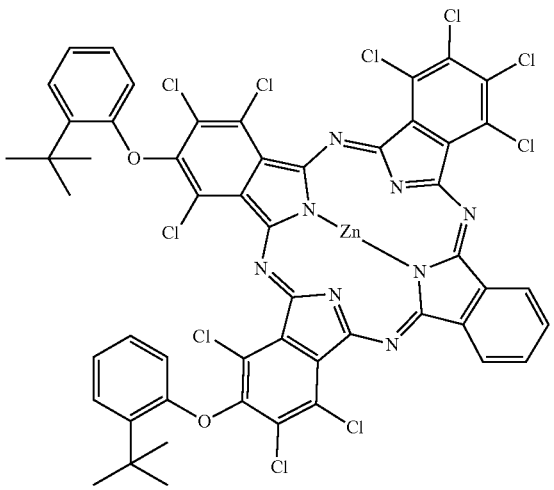

[Chemical Formula 1-4]

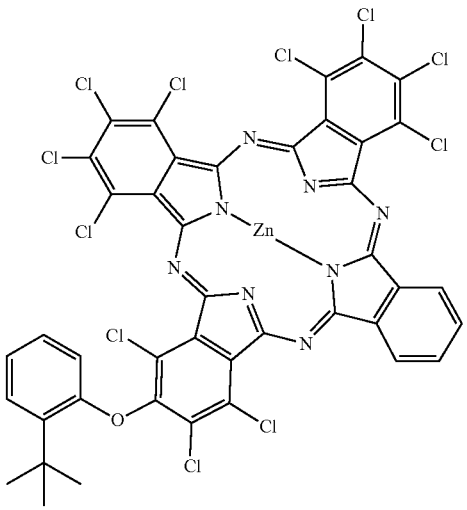

[Chemical Formula 1-5]
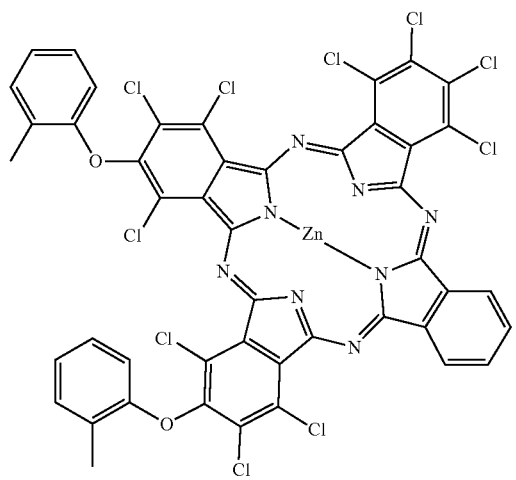
[Chemical Formula 1-6]
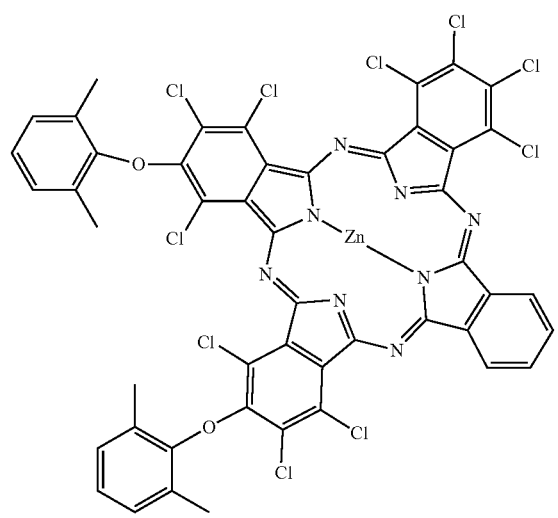
[Chemical Formula 1-7]
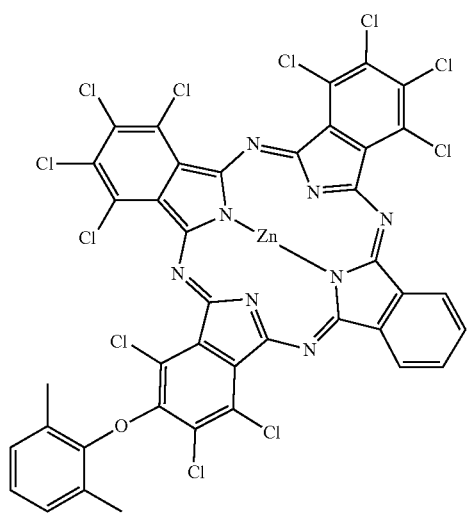
[Chemical Formula 1-8]
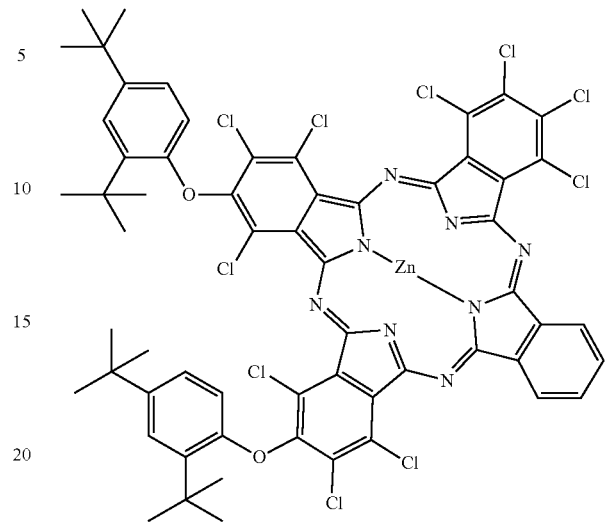
[Chemical Formula 1-9]
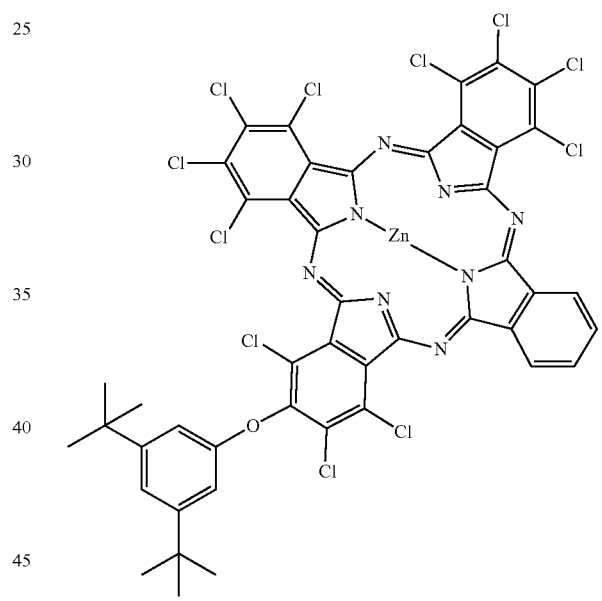
[Chemical Formula 1-10]
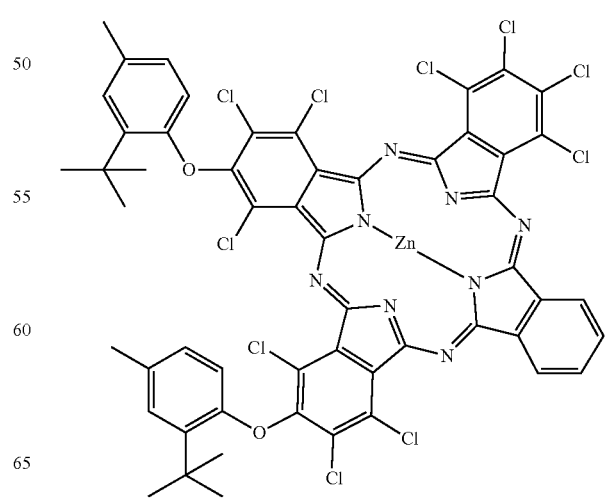

[Chemical Formula 1-11]
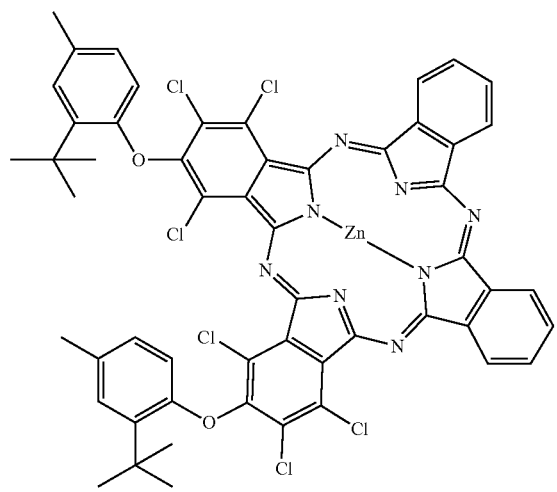
[Chemical Formula 1-12]
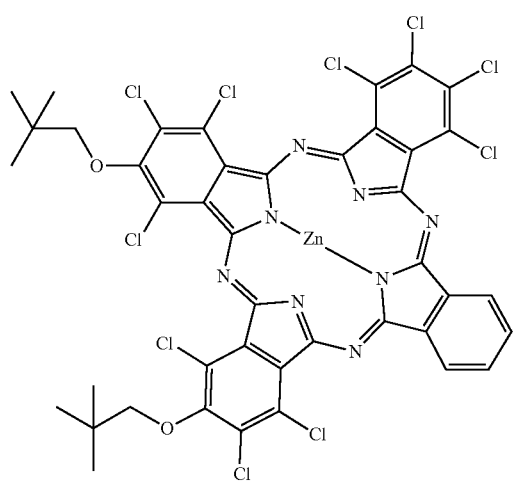
[Chemical Formula 1-13]
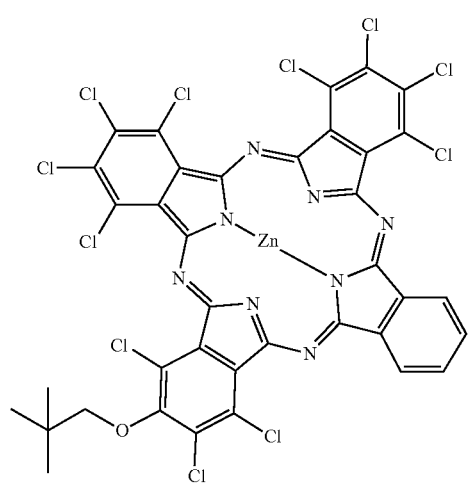
[Chemical Formula 1-14]
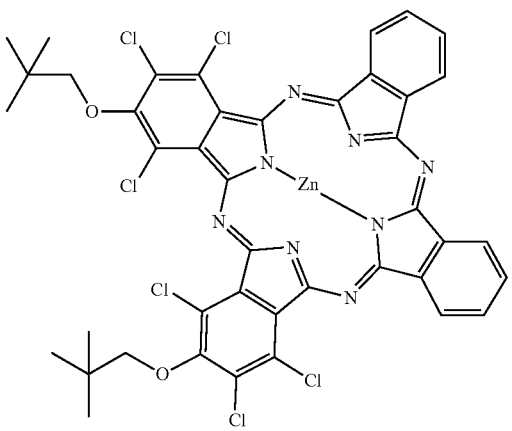
[Chemical Formula 1-15]
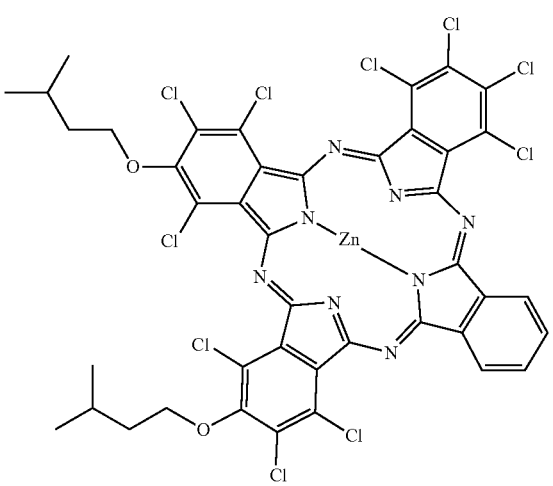
[Chemical Formula 1-16]
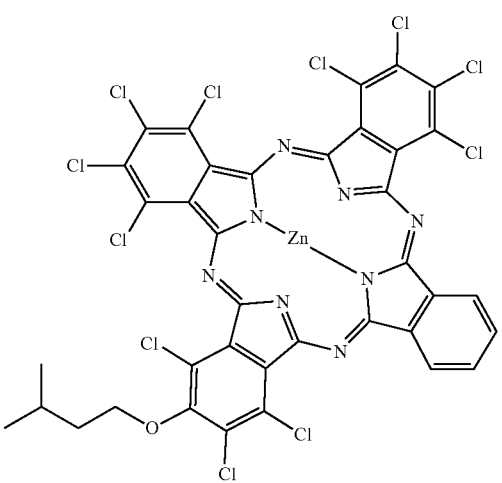

[Chemical Formula 1-17]

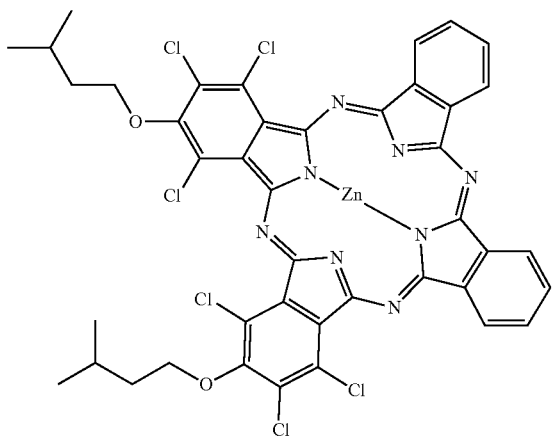

[Chemical Formula 1-18]

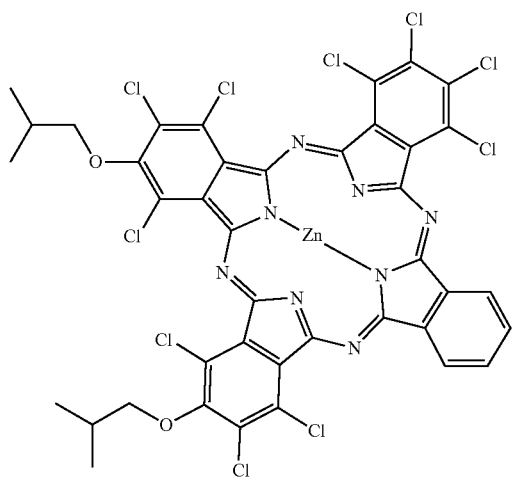

[Chemical Formula 1-19]

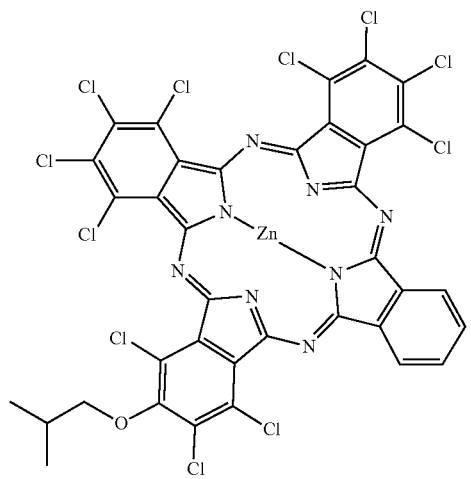

[Chemical Formula 1-20]

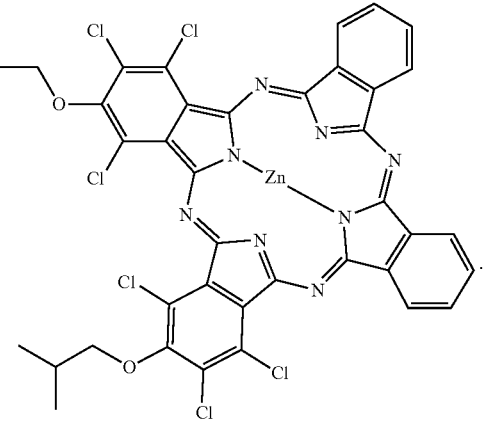

In an implementation, the phthalocyanine compound represented by Chemical Formula 1 may include at least one substituent represented by Chemical Formula 2, a clearer color may be realized even in a smaller amount, and a display device having improved color characteristics such as luminance, a contrast ratio and the like may be manufactured by using the compound as a colorant. In an implementation, the compound may be a colorant, e.g., a dye, e.g., a green dye, e.g., a dye having a maximum transmittance in a wavelength range of about 445 nm to about 560 nm.

A dye may be the most expensive among the components used in a color filter. More of the expensive dye may need to be used to accomplish a desired effect, e.g., high luminance, a high contrast ratio or the like and thus, increase the unit cost of production. When the compound according to an embodiment is used as a dye in a color filter, the compound may accomplish excellent color characteristics such as high luminance, a high contrast ratio and the like and reduce the unit cost of production even when used in a relatively small amount.

In an implementation, a photosensitive resin composition including the phthalocyanine compound according to the embodiment may be provided.

In an implementation, the photosensitive resin composition may include, e.g., the phthalocyanine compound according to the embodiment, a binder resin, a photopolymerizable compound, a photopolymerization initiator, and a solvent.

The compound according to an embodiment may serve as a colorant, e.g., a dye, such as a green dye, in the photosensitive resin composition, and may exhibit excellent color characteristics.

In an implementation, the compound according to an embodiment may be included in an amount of about 1 wt % to about 40 wt %, e.g., about 10 wt % to about 40 wt %, about 20 wt % to about 40 wt %, about 1 wt % to about 30 wt %, about 1 wt % to about 20 wt %, or about 1 wt % to about 10 wt %, based on a total weight of the photosensitive resin composition. When the compound according to the embodiment is included in the above range, color reproduction and contrast ratio are improved.

The photosensitive resin composition may further include a pigment, e.g., a yellow pigment, a green pigment, or a combination thereof.

The yellow pigment may include C.I. pigment yellow 138, C.I. pigment yellow 139, C.I. pigment yellow 150, and the like in a color index, which may be used alone or as a mixture of two or more.

The green pigment may include C.I. pigment green 36, C.I. pigment green 58, C.I. pigment green 59, and the like in a color index, which may be used alone or as a mixture of two or more.

In an implementation, the pigment may be included in a form of pigment dispersion in the photosensitive resin composition.

The pigment dispersion may include a solid pigment, a solvent, and a dispersing agent for uniformly dispersing the pigment into the solvent.

The solid pigment may be included in an amount of about 1 wt % to about 20 wt %, e.g., about 8 wt % to about 20 wt %, about 8 wt % to about 15 wt %, about 10 wt % to about 20 wt %, or about 10 wt % to about 15 wt %, based on a total weight of the pigment dispersion.

The dispersing agent may be a non-ionic dispersing agent, an anionic dispersing agent, a cationic dispersing agent, and the like. Examples of the dispersing agent may include polyalkylene glycol and esters thereof, polyoxyalkylene, a polyhydric alcohol ester alkylene oxide addition product, an alcohol alkylene oxide addition product, a sulfonate ester, a sulfonate salt, a carboxylate ester, a carboxylate salt, an alkylamide alkylene oxide addition product, alkyl amine, and the like. These may be used alone or as a mixture of two or more.

Commercially available examples of the dispersing agent may include DISPERBYK-101, DISPERBYK-130, DISPERBYK-140, DISPERBYK-160, DISPERBYK-161, DISPERBYK-162, DISPERBYK-163, DISPERBYK-164, DISPERBYK-165, DISPERBYK-166, DISPERBYK-170, DISPERBYK-171, DISPERBYK-182, DISPERBYK-2000, DISPERBYK-2001, and the like made by BYK Co., Ltd.; EFKA-47, EFKA-47EA, EFKA-48, EFKA-49, EFKA-100, EFKA-400, EFKA-450, and the like made by EFKA Chemicals Co.; Solsperse 5000, Solsperse 12000, Solsperse 13240, Solsperse 13940, Solsperse 17000, Solsperse 20000, Solsperse 24000GR, Solsperse 27000, Solsperse 28000, and the like made by Zeneka Co.; or PB711 or PB821 made by Ajinomoto Inc.

The dispersing agent may be included in an amount of about 1 wt % to about 20 wt %, based on the total weight of the photosensitive resin composition. When the dispersing agent is included within the range, dispersion of the photosensitive resin composition may be improved due to appropriate viscosity, and optical and physiochemical quality may be maintained.

A solvent for forming the pigment dispersion liquid may include, e.g., ethylene glycol acetate, ethylcellosolve, propylene glycol methyletheracetate, ethyllactate, polyethylene glycol, cyclohexanone, propylene glycol methylether, or the like.

The pigment dispersion may be included in an amount of about 10 wt % to about 20 wt %. e.g., about 12 wt % to about 18 wt %, based on the total weight of the photosensitive resin composition. When the pigment dispersion is included within the range, a process margin may be desirably ensured, and color reproducibility and a contrast ratio are improved.

The binder resin may include an acryl resin.

The acryl resin may be a copolymer of a first ethylenic unsaturated monomer and a second ethylenic unsaturated monomer that is copolymerizable therewith, and may be resin including at least one acryl repeating unit.

The first ethylenic unsaturated monomer may be an ethylenic unsaturated monomer including at least one carboxyl group. Examples of the monomer may include (meth) acrylic acid, maleic acid, itaconic acid, fumaric acid, or a combination thereof.

The first ethylenic unsaturated monomer may be included in an amount of about 5 wt % to about 50 wt %, e.g., about 10 wt % to about 40 wt %, based on a total weight of the acryl binder resin.

The second ethylenic unsaturated monomer may include, e.g., an aromatic vinyl compound such as styrene, α-methylstyrene, vinyl toluene, vinylbenzylmethylether or the like; an unsaturated carboxylate ester compound such as methyl (meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, or the like; an unsaturated amino alkyl carboxylate ester compound such as 2-aminoethyl(meth) acrylate, 2-dimethylaminoethyl(meth)acrylate, or the like; a carboxylic acid vinyl ester compound such as vinyl acetate, vinyl benzoate, or the like; an unsaturated glycidyl carboxylate ester compound such as glycidyl(meth)acrylate, or the like; a vinyl cyanide compound such as (meth)acrylonitrile or the like; an unsaturated amide compound such as (meth) acrylamide, or the like. These may be used alone or as a mixture of two or more.

Examples of the acryl resin may include a (meth)acrylic acid/benzylmethacrylate copolymer, a (meth)acrylic acid/benzylmethacrylate/styrene copolymer, a (meth)acrylic acid/benzylmethacrylate/2-hydroxyethylmethacrylate copolymer, a (meth)acrylic acid/benzylmethacrylate/styrene/2-hydroxyethylmethacrylate copolymer, and the like. These may be used alone or as a mixture of two or more.

In an implementation, the binder resin may further include an epoxy resin along with the acryl resin.

A weight average molecular weight of the binder resin may be about 3,000 g/mol to about 150,000 g/mol, e.g., about 5,000 g/mol to about 50,000 g/mol, or about 20,000 g/mol to about 30,000 g/mol. When the binder resin has a weight average molecular weight within the range, the photosensitive resin composition may have good physical and chemical properties, appropriate viscosity, and close contacting properties with a substrate during production of a color filter.

An acid value of the binder resin may be about 15 mgKOH/g to about 60 mgKOH/g, e.g., about 20 mgKOH/g to about 50 mgKOH/g. When the acid value of the binder resin is within the above range, a resolution of the pixel pattern may be improved.

The binder resin may be included in an amount of about 1 wt % to about 20 wt %, e.g., about 1 wt % to about 15 wt %, or about 1 wt % to about 10 wt %, based on the total weight of the photosensitive resin composition. When the binder resin is included within the above range, developability may be improved and excellent surface smoothness may be improved due to improved cross-linking during the production of a color filter.

The photopolymerizable compound may include a monofunctional or multi-functional ester of (meth)acrylic acid including at least one ethylenic unsaturated double bond.

The photopolymerizable compound may cause sufficient polymerization during exposure in a pattern-forming process and form a pattern having excellent heat resistance, light resistance, and chemical resistance due to the ethylenic unsaturated double bond.

Examples of the photopolymerizable compound may include ethylene glycol di(meth)acrylate, diethylene glycol di(meth)acrylate, triethylene glycol di(meth)acrylate, propylene glycol di(meth)acrylate, neopentyl glycol di(meth) acrylate, 1,4-butanediol di(meth)acrylate, 1,6-hexanediol di(meth)acrylate, bisphenol A di(meth)acrylate, pentaerythritol di(meth)acrylate, pentaerythritol tri(meth)acrylate, pentaerythritol tetra(meth)acrylate, pentaerythritol hexa(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxy(meth)acrylate, ethylene glycol monomethylether (meth)acrylate, trimethylol propane tri(meth)acrylate, tris(meth)acryloyloxyethyl phosphate, novolac epoxy (meth)acrylate, and the like.

Commercially available examples of the photopolymerizable compound may be as follows. The mono-functional (meth)acrylic acid ester may include Aronix M-101®, M-111®, M-114® (Toagosei Chemistry Industry Co., Ltd.); KAYARAD TC-110S®, TC-120S® (Nippon Kayaku Co., Ltd.); V-158®, V-2311® (Osaka Organic Chemical Ind., Ltd.), and the like. Examples of a difunctional (meth)acrylic acid ester may include Aronix M-210®, M-240®, M-6200® (Toagosei Chemistry Industry Co., Ltd.), KAYARAD HDDA®, HX-220®, R-604® (Nippon Kayaku Co., Ltd.), V-260®, V-312®, V-335 HP® (Osaka Organic Chemical Ind., Ltd.), and the like. Examples of a tri-functional (meth)acrylic acid ester may include Aronix M-309®, M-400®, M-405®, M-450®, M-7100®, M-8030®, M-8060® (Toagosei Chemistry Industry Co., Ltd.), KAYARAD TMPTA®, DPCA-20®, DPCA-30®, DPCA-60®, DPCA-120® (Nippon Kayaku Co., Ltd.), V-295®, V-300®, V-360®, V-GPT®, V-3PA®, V-400® (Osaka Yuki Kayaku Kogyo Co. Ltd.), and the like. These may be used alone or as a mixture of two or more.

The photopolymerizable compound may be treated with acid anhydride to help improve developability.

The photopolymerizable compound may be included in an amount of about 1 wt % to about 15 wt %, e.g., about 1 wt % to about 10 wt %, based on the total weight of the photosensitive resin composition. When the photopolymerizable compound is included within the range, the photopolymerizable compound is sufficiently cured during exposure in a pattern-forming process and has excellent reliability, and developability for alkali developing solution may be improved.

The photopolymerization initiator may be a suitable photopolymerization initiator for a photosensitive resin composition, e.g., an acetophenone compound, a benzophenone compound, a thioxanthone compound, a benzoin compound, a triazine compound, an oxime compound, or a combination thereof.

Examples of the acetophenone compound may include 2,2'-diethoxy acetophenone, 2,2'-dibutoxy acetophenone, 2-hydroxy-2-methylpropinophenone, p-t-butyltrichloro acetophenone, p-t-butyldichloroacetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like.

Examples of the benzophenone compound may include benzophenone, benzoyl benzoate, methyl benzoyl benzoate, 4-phenyl benzophenone, hydroxy benzophenone, acrylated benzophenone, 4,4'-bis(dimethyl amino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like.

Examples of the thioxanthone compound may include thioxanthone, 2-methylthioxanthone, isopropyl thioxanthone, 2,4-diethyl thioxanthone, 2,4-diisopropyl thioxanthone, 2-chlorothioxanthone, and the like.

Examples of the benzoin compound may include benzoin, benzoin methyl ether, benzoin ethyl ether, benzoin isopropyl ether, benzoin isobutyl ether, benzyldimethylketal, and the like.

Examples of the triazine compound may include 2,4,6-trichloro-s-triazine, 2-phenyl 4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloro methyl)-s-triazine, 2-biphenyl 4,6-bis(trichloro methyl)-s-triazine, bis(trichloromethyl)-6-styryl-s-triazine, 2-(naphthol-yl)-4,6-bis(trichloromethyl)-s-triazine, 2-(4-methoxynaphthol-yl)-4,6-bis(trichloromethyl)-s-triazine, 2-4-bis(trichloromethyl)-6-piperonyl-s-triazine, 2-4-bis(trichloromethyl)-6-(4-methoxystyryl)-s-triazine, and the like.

Examples of the oxime compound may include an O-acyloxime compound, 2-(O-benzoyloxime)-1-[4-(phenylthio)phenyl]-1,2-octandione, 1-(O-acetyloxime)-1-[9-ethyl-6-(2-methylbenzoyl)-9H-carbazol-3-yl]ethanone, O-ethoxycarbonyl-α-oxyamino-1-phenylpropan-1-one, and the like. Examples of the O-acyloxime compound may include 1,2-octandione, 2-dimethylamino-2-(4-methylbenzyl)-1-(4-morpholin-4-yl-phenyl)-butan-1-one, 1-(4-phenylsulfanyl phenyl)-butane-1,2-dione 2-oxime-O-benzoate, 1-(4-phenylsulfanyl phenyl)-octane-1,2-dione 2-oxime-O-benzoate, 1-(4-phenylsulfanyl phenyl)-octan-1-one oxime-O-acetate, 1-(4-phenylsulfanyl phenyl)-butan-1-one oxime-O-acetate, and the like.

In an implementation, the photopolymerization initiator may further include a carbazole compound, a diketone compound, a sulfonium borate compound, a diazo compound, an imidazole compound, a biimidazole compound, a fluorene compound, or the like, in addition to the compound.

The photopolymerization initiator may be used with a photosensitizer capable of causing a chemical reaction by absorbing light and becoming excited and then, transferring its energy.

Examples of the photosensitizer may include tetraethylene glycol bis-3-mercapto propionate, pentaerythritol tetrakis-3-mercapto propionate, dipentaerythritol tetrakis-3-mercapto propionate, and the like.

The photopolymerization initiator may be included in an amount of about 0.01 wt % to about 10 wt %, e.g., about 0.1 wt % to about 5 wt %, based on the total weight of the photosensitive resin composition. When the photopolymerization initiator is included within the range, excellent reliability may be secured due to sufficiently curing during exposure in a pattern-forming process, a pattern may have excellent resolution and close-contacting properties as well as excellent heat resistance, light resistance, and chemical resistance, and transmittance may be prevented from deterioration due to a non-reaction initiator.

The solvent is a material having compatibility with the compound according to an embodiment, the pigment, the binder resin, the photopolymerizable compound, and the photopolymerization initiator but not reacting therewith.

Examples of the solvent may include alcohols such as methanol, ethanol, and the like; ethers such as dichloroethyl ether, n-butyl ether, diisoamyl ether, methylphenyl ether, tetrahydrofuran, and the like; glycol ethers such as ethylene glycol monomethylether, ethylene glycol monoethylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol monomethylether acetate, propylene glycol propylether acetate, and the like; aromatic hydrocarbons such as toluene, xylene and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactate esters such as methyl lactate, ethyl lactate, and the like; oxy acetic acid alkyl esters such as oxy methyl acetate, oxy ethyl acetate, butyl oxyacetate, and the like; alkoxy acetic acid alkyl esters such as methoxy methyl acetate, methoxy ethyl acetate, methoxy butyl acetate, ethoxy methyl acetate, ethoxy ethyl acetate, and the like; 3-oxy propionic acid alkyl esters such as 3-oxy methyl propionate, 3-oxy ethyl propionate, and the like; 3-alkoxy propionic acid alkyl esters such as 3-methoxy methyl propionate, 3-methoxy ethyl propionate, 3-ethoxy ethyl propionate, 3-ethoxy methyl propionate, and the like; 2-oxy propionic acid alkyl esters such as 2-oxy methyl propionate, 2-oxy ethyl propionate, 2-oxy propyl propionate, and the like; 2-alkoxy propionic acid alkyl esters such as 2-methoxy methyl propionate, 2-methoxy ethyl propionate, 2-ethoxy ethyl propionate, 2-ethoxy methyl propionate, and the like; 2-oxy-2-methyl propionic acid esters such 2-oxy-2-methyl methyl propionate, 2-oxy-2-methyl ethyl propionate, and the like, monooxy monocarboxylic acid alkyl esters of 2-alkoxy-2-methyl alkyl propionates such as 2-methoxy-2-methyl methyl propionate, 2-ethoxy-2-methyl ethyl propionate, and the like; esters such as 2-hydroxy ethyl propionate, 2-hydroxy-2-methyl ethyl propionate, hydroxy ethyl acetate, 2-hydroxy-3-methyl methyl butanoate, and the like; ketonate esters such as ethyl pyruvate, and the like. In an implementation, a high boiling point solvent such as N-methylformamide, N,N-dimethylformamide, N-methylformanilide, N-methylacetamide, N,N-dimethylacetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate, phenyl cellosolve acetate, or the like, may be also used.

In an implementation, considering miscibility and reactivity, glycol ethers such as ethylene glycol monoethylether, and the like; ethylene glycol alkylether acetates such as ethyl cellosolve acetate, and the like; esters such as 2-hydroxy ethyl propionate, and the like; carbitols such as diethylene glycol monomethylether, and the like; propylene glycol alkylether acetates such as propylene glycol methylether acetate, propylene glycol propylether acetate, and the like; and/or ketones such as cyclohexanone, and the like may be used.

The solvent may be included in a balance amount, e.g., about 30 wt % to about 80 wt %, based on the total weight of the photosensitive resin composition. When the solvent is included within the range, the photosensitive resin composition may have an appropriate viscosity and thus processability is improved during a production of a color filter.

In an implementation, the photosensitive resin composition may further include a compound represented by Chemical Formula 3.

[Chemical Formula 3]

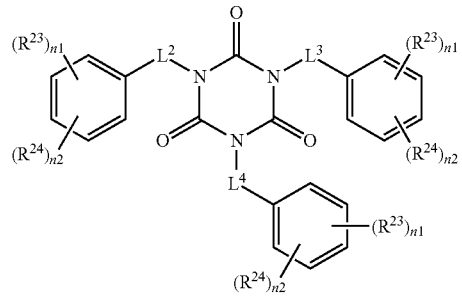

In Chemical Formula 3,
$R^{23}$ and $R^{24}$ may each independently be or include, e.g., a hydroxy group or a substituted or unsubstituted C1 to C20 alkyl group,
$L^2$ to $L^4$ may each independently be or include, e.g., a substituted or unsubstituted C1 to C20 alkylene group, and
n1 and n2 may each independently be, e.g., an integer of 0 to 5. In an implementation, $3 \leq n1+n2 \leq 5$.

In an implementation, the compound represented by Chemical Formula 3 may function as an antioxidant.

In an implementation, in Chemical Formula 3, $R^{23}$ may be a C1 to C20 alkyl group substituted with an alkyl group, $R^{24}$ may be a hydroxy group, n1 may be 2, and n2 may be 1.

The photosensitive resin composition according to another embodiment may further include an epoxy compound in order to help improve close-contacting properties with a substrate.

Examples of the epoxy compound may include a phenol novolac epoxy compound, a tetramethyl biphenyl epoxy compound, a bisphenol A epoxy compound, an alicyclic epoxy compound, or a combination thereof.

The epoxy compound may be included in an amount of about 0.01 to about 20 parts by weight, e.g., about 0.1 to about 10 parts by weight, based on 100 parts by weight of the photosensitive resin composition. When the epoxy compound is included within the ranges, close-contacting properties, storage properties, and the like may be improved.

In an implementation, the photosensitive resin composition may further include a silane coupling agent having a reactive substituent such as a carboxyl group, a methacryloyl group, an isocyanate group, an epoxy group, or the like, to help improve its adherence to a substrate.

Examples of the silane coupling agent may include trimethoxysilyl benzoic acid, γ-methacryl oxypropyl trimethoxysilane, vinyl triacetoxysilane, vinyl trimethoxysilane, γ-isocyanate propyl triethoxysilane, γ-glycidoxy propyl trimethoxysilane, β-epoxycyclohexyl)ethyltrimethoxysilane, and the like. These may be used alone or in a mixture of two or more.

The silane coupling agent may be included in an amount of about 0.01 parts by weight to about 10 parts by weight, based on 100 parts by weight of the photosensitive resin composition. When the silane coupling agent is included within the range, close-contacting properties, storing properties, and the like may be improved.

In an implementation, the photosensitive resin composition may further include a surfactant in order to help improve coating properties and prevent a defect.

Examples of the surfactant may include a fluorene surfactant, e.g., BM-1000®, and BM-1100® (BM Chemie Inc.); MEGAFACE F 142D®, F 172®, F 173®, and F 183® Dainippon Ink Kagaku Kogyo Co., Ltd.); FULORAD FC-135®, FULORAD FC-170C®, FULORAD FC-430®, and FULORAD FC-431® (Sumitomo 3M Co., Ltd.); SURFLON S-112®, SURFLON S-113®, SURFLON S-131®, SURFLON S-141®, and SURFLON S-145® (ASAHI Glass Co., Ltd.); and SH-28PA®, SH-190®, SH-193®, SZ-6032®, and SF-8428®, and the like (Toray Silicone Co., Ltd.).

The surfactant may be included in an amount of about 0.001 to about 5 parts by weight, based on 100 parts by weight of the photosensitive resin composition. When the surfactant is included within the ranges, excellent wetting on a glass substrate as well as coating uniformity may be secured, but a stain may not be produced.

In an implementation, the photosensitive resin composition may include other additives such as an antioxidant, a stabilizer, or the like in a suitable amount, unless they deteriorate properties of the photosensitive resin composition.

According to another embodiment, a color filter produced using the photosensitive resin composition according to the embodiment may be provided.

A pattern-forming process in the color filter may be as follows.

The process may include coating the positive photosensitive resin composition on a support substrate in a method of spin coating, slit coating, inkjet printing, or the like; drying the coated positive photosensitive resin composition to form a photosensitive resin composition film; exposing the positive photosensitive resin composition film to light; developing the exposed positive photosensitive resin composition film in an alkali aqueous solution to obtain a photosensitive resin layer; and heat-treating the photosensitive resin layer.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

(Synthesis of Compounds)

Synthesis Example 1: Synthesis of Compound Represented by Chemical Formula 1-1

3,4,5,6-tetrachlorophthalonitrile (5 g), 2-isopropylphenol (2.56 g), K$_2$CO$_3$ (3.9 g), and N,N-dimethyl formamide (25 ml) were put in a 100 ml flask and stirred while heated at 70° C. When the reaction was complete, EA (ethyl acetate) was used for an extraction. After extraction, the resultant was concentrated and purified by column chromatography. After purification, the resultant was vacuum-dried to obtain 4-(2-isopropropyl-phenoxy)-3,5,6-trichloro-phthalonitrile.

4-(2-isopropyl-phenoxy)-3,5,6-trichloro-phthalonitrile (2 g), 3,4,5,6-tetrachlorophthalonitrile (0.73 g), phthalonitrile (0.35 g), 1,8-diazabicycloundec-7-ene (2.08 g), and 1-pentenol (15 g) were put in a 100 ml flask and were heated to 90° C. to dissolve the solids, zinc acetate (0.50 g) was added, and the resultant was stirred while heating to 140° C. When the reaction was complete, methanol was used for a precipitation, and a precipitate therefrom was filtered and vacuum-dried. The dried solid was purified through column chromatography. Dichloromethane was appropriately added to the purified solid and dissolve it, and methanol was added thereto to crystallize it. The crystallized solid was filtered and vacuum-dried to obtain a compound represented by Chemical Formula 1-1.

[Chemical Formula 1-1]

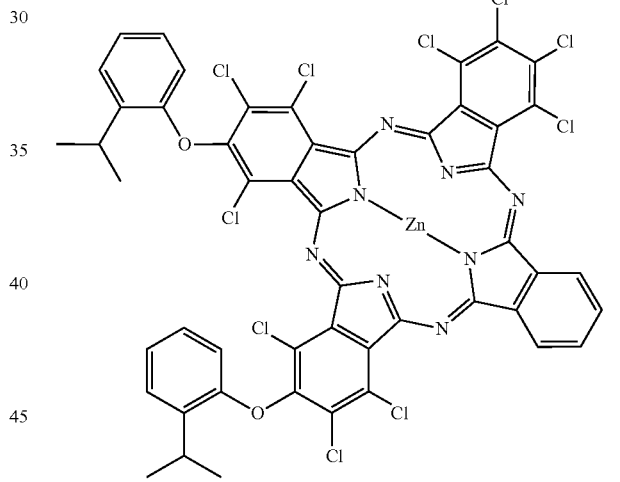

MALDI-TOF MS: 1190.69 m/z

Synthesis Example 2: Synthesis of Compound Represented by Chemical Formula 1-2

4-(2-isopropropyl-phenoxy)-3,5,6-trichloro-phthalonitrile (2 g), 3,4,5,6-tetrachlorophthalonitrile (2.91 g), phthalonitrile (0.70 g), 1,8-diazabicycloundec-7-ene (4.16 g), and 1-pentenol (30 g) were put in a 100 ml flask and were heated to 90° C. to dissolve the solids, zinc acetate (1.00 g) was added, and the resultant was stirred while heating to 140° C. When the reaction was complete, methanol was used for a precipitation, and a precipitate therefrom was filtered and vacuum-dried. The dried solid was purified through column chromatography. Dichloromethane was appropriately added to the purified solid and dissolve it, and methanol was added thereto to crystallize it. The crystallized solid was filtered and vacuum-dried to obtain a compound represented by Chemical Formula 1-2.

[Chemical Formula 1-2]

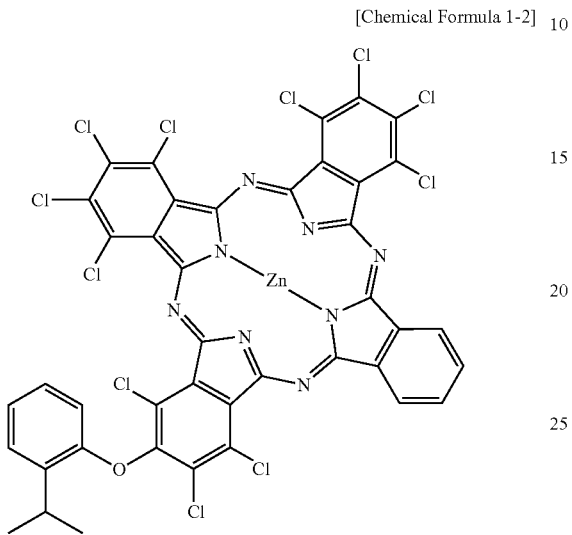

MALDI-TOF MS: 1090.96 m/z

Synthesis Example 3: Synthesis of Compound Represented by Chemical Formula 1-3

3,4,5,6-tetrachlorophthalonitrile (5 g), 2-tert-butyl-phenol (2.83 g), K₂CO₃ (3.9 g), and N,N-dimethyl formamide (25 ml) were put in a 100 ml flask and stirred while heated at 70° C. When the reaction was complete, EA (ethyl acetate) was used for an extraction. After extraction, the resultant was concentrated and purified by column chromatography. After purification, the resultant was vacuum-dried to obtain 4-(2-tert-butyl-phenoxy)-3,5,6-trichloro-phthalonitrile.

4-(2-tert-butyl-phenoxy)-3,5,6-trichloro-phthalonitrile (2 g), 3,4,5,6-tetrachlorophthalonitrile (0.70 g), phthalonitrile (0.34 g), 1,8-diazabicycloundec-7-ene (2.01 g), and 1-pentenol (15 g) were put in a 100 ml flask and were heated to 90° C. to dissolve the solids, zinc acetate (0.48 g) was added, and the resultant was stirred while heating to 140° C. When the reaction was complete, methanol was used for a precipitation, and a precipitate therefrom was filtered and vacuum-dried. The dried solid was purified through column chromatography. Dichloromethane was appropriately added to the purified solid and dissolve it, and methanol was added thereto to crystallize it. The crystallized solid was filtered and vacuum-dried to obtain a compound represented by Chemical Formula 1-3.

[Chemical Formula 1-3]

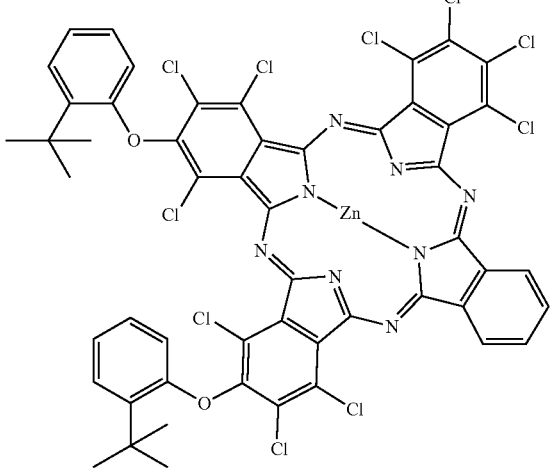

MALDI-TOF MS: 1218.75 m/z

Synthesis Example 4: Synthesis of Compound Represented by Chemical Formula 1-4

4-(2-tert-butyl-phenoxy)-3,5,6-trichloro-phthalonitrile (2 g), 3,4,5,6-tetrachlorophthalonitrile (2.80 g), phthalonitrile (0.67 g), 1,8-diazabicycloundec-7-ene (4.01 g), and 1-pentenol (30 g) were put in a 100 ml flask and were heated to 90° C. to dissolve the solids, zinc acetate (0.97 g) was added, and the resultant was stirred while heating to 140° C. When the reaction was complete, methanol was used for a precipitation, and a precipitate therefrom was filtered and vacuum-dried. The dried solid was purified through column chromatography. Dichloromethane was appropriately added to the purified solid and dissolve it, and methanol was added thereto to crystallize it. The crystallized solid was filtered and vacuum-dried to obtain a compound represented by Chemical Formula 1-4.

[Chemical Formula 1-4]

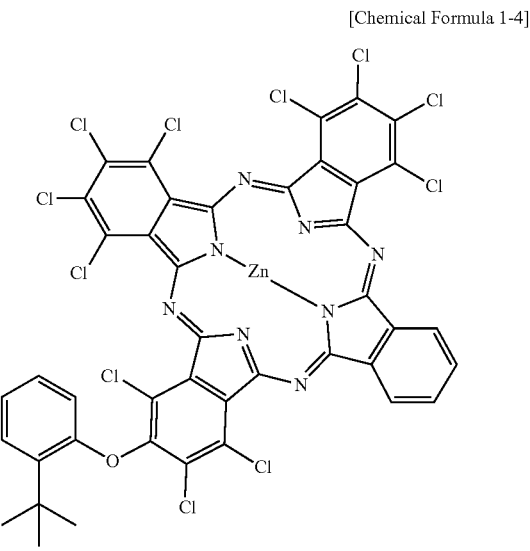

MALDI-TOF MS: 1104.98 m/z

Synthesis Example 5: Synthesis of Compound Represented by Chemical Formula 1-5

3,4,5,6-tetrachlorophthalonitrile (5 g), p-cresol (2.83 g), $K_2CO_3$ (3.9 g), and N,N-dimethyl formamide (25 ml) were put in a 100 ml flask and stirred while heated at 70° C. When the reaction was complete, EA (ethyl acetate) was used for an extraction. After extraction, the resultant was concentrated and purified by column chromatography. After purification, the resultant was vacuum-dried to obtain 4-(2-methyl-phenoxy)-3,5,6-trichloro-phthalonitrile.

4-(2-methyl-phenoxy)-3,5,6-trichloro-phthalonitrile (2 g), 3,4,5,6-tetrachlorophthalonitrile (0.79 g), phthalonitrile (0.38 g), 1,8-diazabicycloundec-7-ene (2.26 g) and 1-pentenol (15 g) were put in a 100 ml flask and were heated to 90° C. to dissolve the solids, zinc acetate (0.54 g) was added, and the resultant was stirred while heating to 140° C. When the reaction was complete, methanol was used for a precipitation, and a precipitate therefrom was filtered and vacuum-dried. The dried solid was purified through column chromatography. Dichloromethane was appropriately added to the purified solid and dissolve it, and methanol was added thereto to crystallize it. The crystallized solid was filtered and vacuum-dried to obtain a compound represented by Chemical Formula 1-5.

[Chemical Formula 1-5]

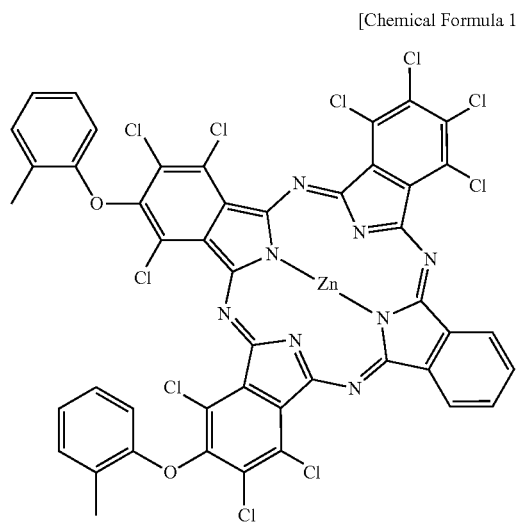

MALDI-TOF MS: 1134.58 m/z

Synthesis Example 6: Synthesis of Compound Represented by Chemical Formula 1-6

3,4,5,6-tetrachlorophthalonitrile (5 g), 2,6-dimethylphenol (2.30 g), $K_2CO_3$ (3.9 g), and N,N-dimethyl formamide (25 ml) were put in a 100 ml flask and stirred while heated at 70° C. When the reaction was complete, EA (ethyl acetate) was used for an extraction. After extraction, the resultant was concentrated and purified by column chromatography. After purification, the resultant was vacuum-dried to obtain 4-(2,6-dimethyl-phenoxy)-3,5,6-trichloro-phthalonitrile.

4-(2,6-dimethyl-phenoxy)-3,5,6-trichloro-phthalonitrile (2 g), 3,4,5,6-tetrachlorophthalonitrile (0.76 g), phthalonitrile (0.36 g), 1,8-diazabicycloundec-7-ene (2.17 g), and 1-pentenol (15 g) were put in a 100 ml flask and were heated to 90° C. to dissolve the solids, zinc acetate (0.52 g) was added, and the resultant was stirred while heating to 140° C. When the reaction was complete, methanol was used for a precipitation, and a precipitate therefrom was filtered and vacuum-dried. The dried solid was purified through column chromatography. Dichloromethane was appropriately added to the purified solid and dissolve it, and methanol was added thereto to crystallize it. The crystallized solid was filtered and vacuum-dried to obtain a compound represented by Chemical Formula 1-6.

[Chemical Formula 1-6]

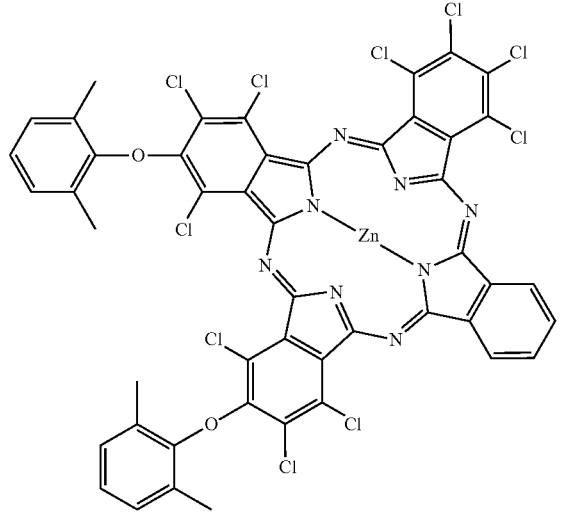

MALDI-TOF MS: 1162.64 m/z

Synthesis Example 7: Synthesis of Compound Represented by Chemical Formula 1-7

4-(2,6-dimethyl-phenoxy)-3,5,6-trichloro-phthalonitrile (2 g), 3,4,5,6-tetrachlorophthalonitrile (3.03 g), phthalonitrile (0.73 g), 1,8-diazabicycloundec-7-ene (4.33 g), and 1-pentenol (30 g) were put in a 100 ml flask and were heated to 90° C. to dissolve the solids, zinc acetate (1.04 g) was added, and the resultant was stirred while heating to 140° C. When the reaction was complete, methanol was used for a precipitation, and a precipitate therefrom was filtered and vacuum-dried. The dried solid was purified through column chromatography. Dichloromethane was appropriately added to the purified solid and dissolve it, and methanol was added thereto to crystallize it. The crystallized solid was filtered and vacuum-dried to obtain a compound represented by Chemical Formula 1-7.

[Chemical Formula 1-7]

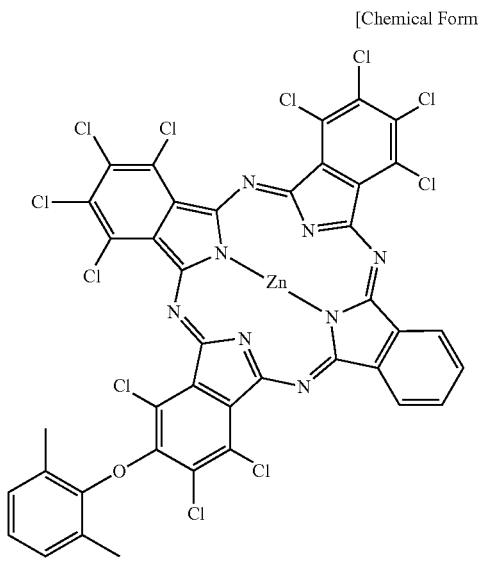

MALDI-TOF MS: 1076.93 m/z

Synthesis Example 8: Synthesis of Compound Represented by Chemical Formula 1-8

3,4,5,6-tetrachlorophthalonitrile (5 g), 2,4-di-t-butylphenol (3.9 g), K$_2$CO$_3$ (3.9 g), and N,N-dimethyl formamide (25 ml) were put in a 100 ml flask and stirred while heated at 70° C. When the reaction was complete, EA (ethyl acetate) was used for an extraction. After extraction, the resultant was concentrated and purified by column chromatography. After purification, the resultant was vacuum-dried to obtain 4-(2,4-di-t-butyl-phenoxy)-3,5,6-trichloro-phthalonitrile.

4-(2,4-di-t-butyl-phenoxy)-3,5,6-trichloro-phthalonitrile (2 g), 3,4,5,6-tetrachlorophthalonitrile (0.70 g), phthalonitrile (0.34 g), 1,8-diazabicycloundec-7-ene (2.01 g), and 1-pentenol (15 g) were put in a 100 ml flask and were heated to 90° C. to dissolve the solids, zinc acetate (0.48 g) was added, and the resultant was stirred while heating to 140° C. When the reaction was complete, methanol was used for a precipitation, and a precipitate therefrom was filtered and vacuum-dried. The dried solid was purified through column chromatography. Dichloromethane was appropriately added to the purified solid and dissolve it, and methanol was added thereto to crystallize it. The crystallized solid was filtered and vacuum-dried to obtain a compound represented by Chemical Formula 1-8.

[Chemical Formula 1-8]

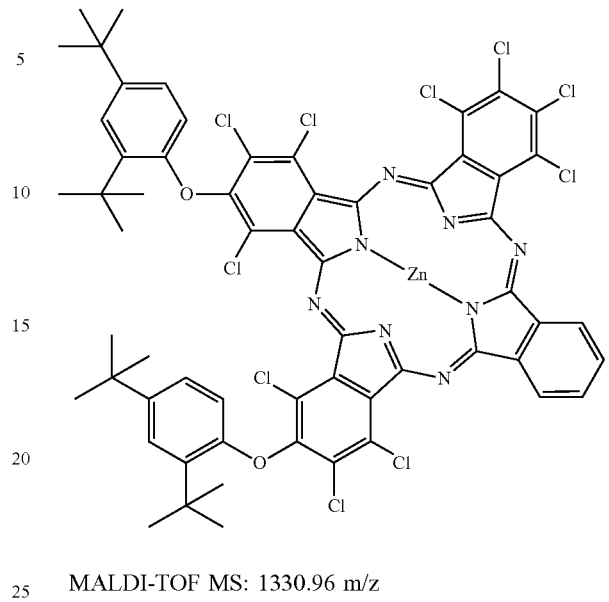

MALDI-TOF MS: 1330.96 m/z

Synthesis Example 9: Synthesis of Compound Represented by Chemical Formula 1-9

4-(2,4-di-t-butyl-phenoxy)-3,5,6-trichloro-phthalonitrile (2 g), 3,4,5,6-tetrachlorophthalonitrile (2.80 g), phthalonitrile (0.68 g), 1,8-diazabicycloundec-7-ene (4.01 g), and 1-pentenol (15 g) were put in a 100 ml flask and were heated to 90° C. to dissolve the solids, zinc acetate (0.97 g) was added, and the resultant was stirred while heating to 140° C. When the reaction was complete, methanol was used for a precipitation, and a precipitate therefrom was filtered and vacuum-dried. The dried solid was purified through column chromatography. Dichloromethane was appropriately added to the purified solid and dissolve it, and methanol was added thereto to crystallize it. The crystallized solid was filtered and vacuum-dried to obtain a compound represented by Chemical Formula 1-9.

[Chemical Formula 1-9]

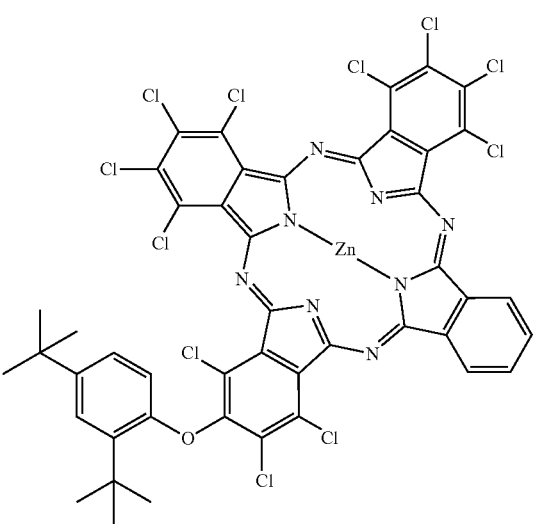

MALTDT-TOF MS: 1161.09 m/z

Synthesis Example 10: Synthesis of Compound Represented by Chemical Formula 1-10

3,4,5,6-tetrachlorophthalonitrile (5 g), 2-tert-butyl-4-methylphenol (3.09 g), $K_2CO_3$ (3.9 g), and N,N-dimethyl formamide (25 ml) were put in a 100 ml flask and stirred while heated at 70° C. When the reaction was complete, EA (ethyl acetate) was used for an extraction. After extraction, the resultant was concentrated and purified by column chromatography. After purification, the resultant was vacuum-dried to obtain 4-(2-tert-butyl-4-methyl phenoxy)-3,5,6-trichloro-phthalonitrile.

4-(2-tert-butyl-4-methylphenoxy)-3,5,6-trichloro-phthalonitrile (2 g), 3,4,5,6-tetrachlorophthalonitrile (0.68 g), phthalonitrile (0.33 g), 1,8-diazabicycloundec-7-ene (1.9 g), and 1-pentenol (15 g) were put in a 100 ml flask and were heated to 90° C. to dissolve the solids, zinc acetate (0.47 g) was added, and the resultant was stirred while heating to 140° C. When the reaction was complete, methanol was used for a precipitation, and a precipitate therefrom was filtered and vacuum-dried. The dried solid was purified through column chromatography. Dichloromethane was appropriately added to the purified solid and dissolve it, and methanol was added thereto to crystallize it. The crystallized solid was filtered and vacuum-dried to obtain a compound represented by Chemical Formula 1-10.

[Chemical Formula 1-10]

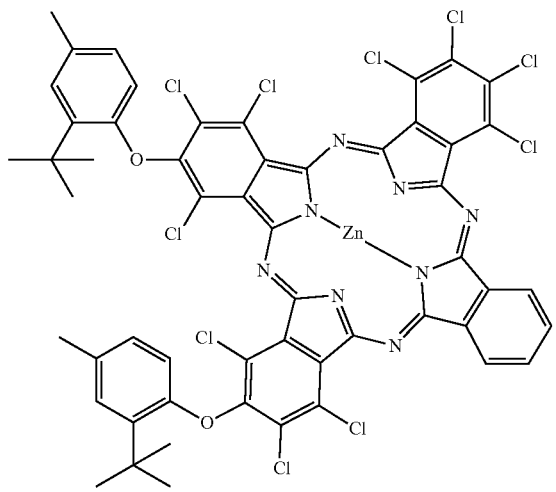

MALDI-TOF MS: 1246.80 m/z

Synthesis Example 11: Synthesis of Compound Represented by Chemical Formula 1-11

4-(2-tert-butyl-4-methylphenoxy)-3,5,6-trichloro-phthalonitrile (2 g), phthalonitrile (0.65 g), 1,8-diazabicycloundec-7-ene (1.9 g), and 1-pentenol (15 g) were put in a 100 ml flask and were heated to 90° C. to dissolve the solids, zinc acetate (0.47 g) was added, and the resultant was stirred while heating to 140° C. When the reaction was complete, methanol was used for a precipitation, and a precipitate therefrom was filtered and vacuum-dried. The dried solid was purified through column chromatography. Dichloromethane was appropriately added to the purified solid and dissolve it, and methanol was added thereto to crystallize it. The crystallized solid was filtered and vacuum-dried to obtain a compound represented by Chemical Formula 1-11.

[Chemical Formula 1-11]

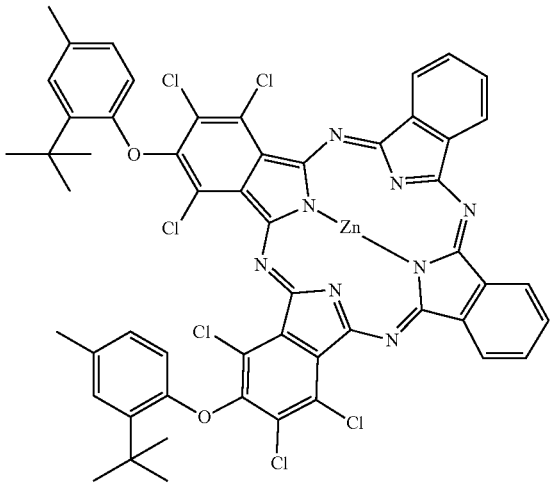

MALDI-TOF MS: 1109.03 m/z

Synthesis Example 12: Synthesis of Compound Represented by Chemical Formula 1-12

3,4,5,6-tetrachlorophthalonitrile (5 g), 2,2-dimethyl-1-propanol (1.66 g), diazabicycloundec-7-ene (4.29 g), and N,N-dimethyl formamide (25 ml) were put in a 100 ml flask and stirred while heated at 70° C. When the reaction was complete, EA (ethyl acetate) was used for an extraction. After extraction, the resultant was concentrated and purified by column chromatography. After purification, the resultant was vacuum-dried to obtain 4-(2,2-dimethyl-1-propoxy)-3,5,6-trichloro-phthalonitrile.

4-(2,2-dimethyl-1-propoxy)-3,5,6-trichloro-phthalonitrile (2 g), 3,4,5,6-tetrachlorophthalonitrile (0.84 g), phthalonitrile (0.40 g), 1,8-diazabicycloundec-7-ene (2.40 g), and 1-pentenol (15 g) were put in a 100 ml flask and were heated to 90° C. to dissolve the solids, zinc acetate (0.58 g) was added, and the resultant was stirred while heating to 140° C. When the reaction was complete, methanol was used for a precipitation, and a precipitate therefrom was filtered and vacuum-dried. The dried solid was purified through column chromatography. Dichloromethane was appropriately added to the purified solid and dissolve it, and methanol was added thereto to crystallize it. The crystallized solid was filtered and vacuum-dried to obtain a compound represented by Chemical Formula 1-12.

[Chemical Formula 1-12]

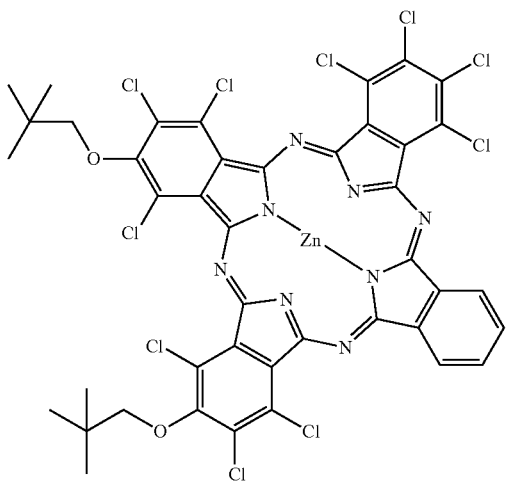

MALDI-TOF MS: 1094.60 m/z

Synthesis Example 13: Synthesis of Compound Represented by Chemical Formula 1-13

4-(2,2-dimethyl-1-propoxy)-3,5,6-trichloro-phthalonitrile (1 g), 3,4,5,6-tetrachlorophthalonitrile (1.67 g), phthalonitrile (0.40 g), 1,8-diazabicycloundec-7-ene (2.40 g), and 1-pentenol (15 g) were put in a 100 ml flask and were heated to 90° C. to dissolve the solids, zinc acetate (0.58 g) was added, and the resultant was stirred while heating to 140° C. When the reaction was complete, methanol was used for a precipitation, and a precipitate therefrom was filtered and vacuum-dried. The dried solid was purified through column chromatography. Dichloromethane was appropriately added to the purified solid and dissolve it, and methanol was added thereto to crystallize it. The crystallized solid was filtered and vacuum-dried to obtain a compound represented by Chemical Formula 1-13.

[Chemical Formula 1-13]

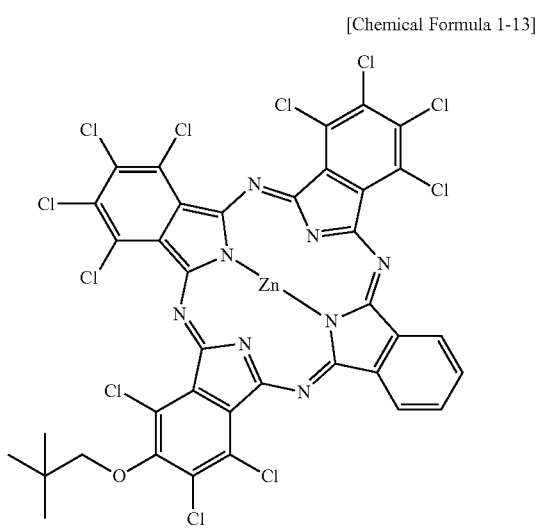

MALDI-TOF MS: 1042.91 m/z

Synthesis Example 14: Synthesis of Compound Represented by Chemical Formula 1-14

4-(2,2-dimethyl-1-propoxy)-3,5,6-trichloro-phthalonitrile (2 g), phthalonitrile (0.81 g), 1,8-diazabicycloundec-7-ene (2.40 g), and 1-pentenol (15 g) were put in a 100 ml flask and were heated to 90° C. to dissolve the solids, zinc acetate (0.58 g) was added, and the resultant was stirred while heating to 140° C. When the reaction was complete, methanol was used for a precipitation, and a precipitate therefrom was filtered and vacuum-dried. The dried solid was purified through column chromatography. Dichloromethane was appropriately added to the purified solid and dissolve it, and methanol was added thereto to crystallize it. The crystallized solid was filtered and vacuum-dried to obtain a compound represented by Chemical Formula 1-14.

[Chemical Formula 1-14]

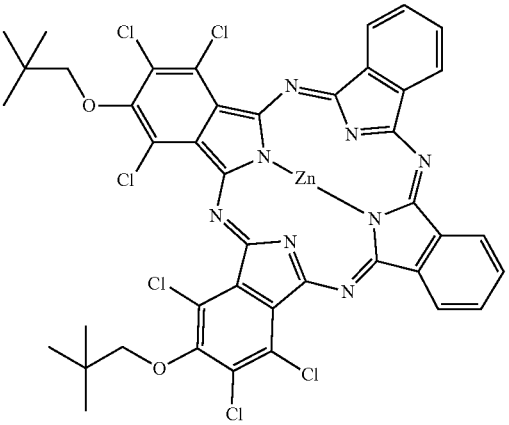

MALDI-TOF MS: 956.84 m/z

Synthesis Example 15: Synthesis of Compound Represented by Chemical Formula 1-15

3,4,5,6-tetrachlorophthalonitrile (5 g), 3-methyl-1-butanol (1.66 g), diazabicycloundec-7-ene (4.29 g), and N,N-dimethyl formamide (25 ml) were put in a 100 ml flask and stirred while heated at 70° C. When the reaction was complete, EA (ethyl acetate) was used for an extraction. After extraction, the resultant was concentrated and purified by column chromatography. After purification, the resultant was vacuum-dried to obtain 4-(3-methyl-1-butoxy)-3,5,6-trichloro-phthalonitrile.

4-(3-methyl-1-butoxy)-3,5,6-trichloro-phthalonitrile (2 g), 3,4,5,6-tetrachlorophthalonitrile (0.84 g), phthalonitrile (0.40 g), 1,8-diazabicycloundec-7-ene (2.40 g), and 1-pentenol (15 g) were put in a 100 ml flask and were heated to 90° C. to dissolve the solids, zinc acetate (0.58 g) was added, and the resultant was stirred while heating to 140° C. When the reaction was complete, methanol was used for a precipitation, and a precipitate therefrom was filtered and vacuum-dried. The dried solid was purified through column chromatography. Dichloromethane was appropriately added to the purified solid and dissolve it, and methanol was added thereto to crystallize it. The crystallized solid was filtered and vacuum-dried to obtain a compound represented by Chemical Formula 1-15.

[Chemical Formula 1-15]

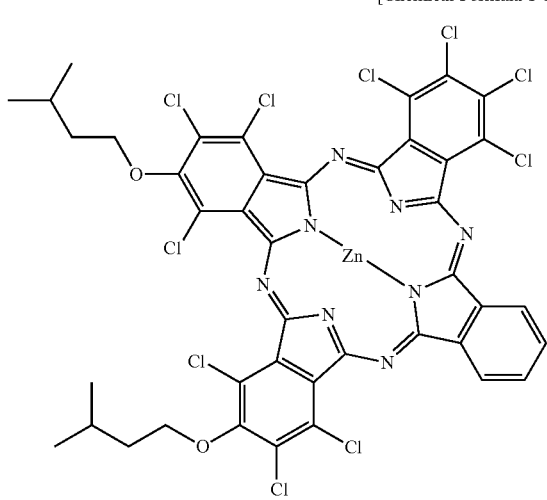

MALDI-TOF MS: 1094.60 m/z

Synthesis Example 16: Synthesis of Compound Represented by Chemical Formula 1-16

4-(3-methyl-1-butoxy)-3,5,6-trichloro-phthalonitrile (1 g), 3,4,5,6-tetrachlorophthalonitrile (1.67 g), phthalonitrile (0.40 g), 1,8-diazabicycloundec-7-ene (2.40 g), and 1-pentenol (15 g) were put in a 100 ml flask and were heated to 90° C. to dissolve the solids, zinc acetate (0.58 g) was added, and the resultant was stirred while heating to 140° C. When the reaction was complete, methanol was used for a precipitation, and a precipitate therefrom was filtered and vacuum-dried. The dried solid was purified through column chromatography. Dichloromethane was appropriately added to the purified solid and dissolve it, and methanol was added thereto to crystallize it. The crystallized solid was filtered and vacuum-dried to obtain a compound represented by Chemical Formula 1-16.

[Chemical Formula 1-16]

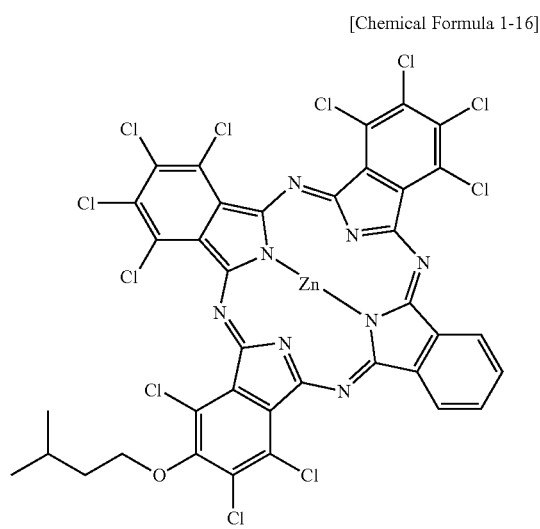

MALDI-TOF MS: 1042.91 m/z

Synthesis Example 17: Synthesis of Compound Represented by Chemical Formula 1-17

4-(3-methyl-1-butoxy)-3,5,6-trichloro-phthalonitrile (2 g), phthalonitrile (0.81 g), 1,8-diazabicycloundec-7-ene (2.40 g), and 1-pentenol (15 g) were put in a 100 ml flask and were heated to 90° C. to dissolve the solids, zinc acetate (0.58 g) was added, and the resultant was stirred while heating to 140° C. When the reaction was complete, methanol was used for a precipitation, and a precipitate therefrom was filtered and vacuum-dried. The dried solid was purified through column chromatography. Dichloromethane was appropriately added to the purified solid and dissolve it, and methanol was added thereto to crystallize it. The crystallized solid was filtered and vacuum-dried to obtain a compound represented by Chemical Formula 1-17.

[Chemical Formula 1-17]

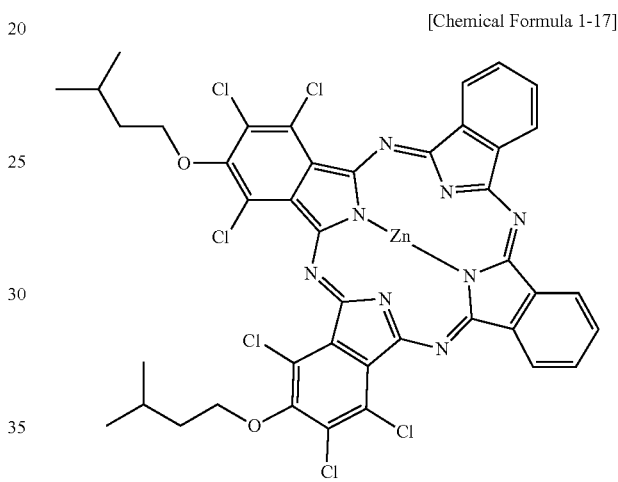

MALDI-TOF MS: 956.84 m/z

Synthesis Example 18: Synthesis of Compound Represented by Chemical Formula 1-18

3,4,5,6-tetrachlorophthalonitrile (5 g), 2-methyl-1-propanol (1.39 g), diazabicycloundec-7-ene (4.29 g), and N,N-dimethyl formamide (25 ml) were put in a 100 ml flask and stirred while heated at 70° C. When the reaction was complete, EA (ethyl acetate) was used for an extraction. After extraction, the resultant was concentrated and purified by column chromatography. After purification, the resultant was vacuum-dried to obtain 4-(3-methyl-1-butoxy)-3,5,6-trichloro-phthalonitrile.

4-(2-methyl-1-propoxy)-3,5,6-trichloro-phthalonitrile (2 g), 3,4,5,6-tetrachlorophthalonitrile (0.88 g), phthalonitrile (0.42 g), 1,8-diazabicycloundec-7-ene (2.52 g), and 1-pentenol (15 g) were put in a 100 ml flask and were heated to 90° C. to dissolve the solids, zinc acetate (0.61 g) was added, and the resultant was stirred while heating to 140° C. When the reaction was complete, methanol was used for a precipitation, and a precipitate therefrom was filtered and vacuum-dried. The dried solid was purified through column chromatography. Dichloromethane was appropriately added to the purified solid and dissolve it, and methanol was added thereto to crystallize it. The crystallized solid was filtered and vacuum-dried to obtain a compound represented by Chemical Formula 1-18.

[Chemical Formula 1-18]

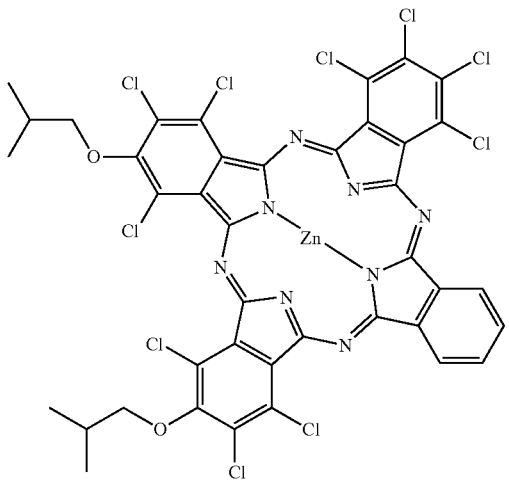

MALDI-TOF MS: 1066.55 m/z

Synthesis Example 19: Synthesis of Compound Represented by Chemical Formula 1-19

4-(2-methyl-1-propoxy)-3,5,6-trichloro-phthalonitrile (1 g), 3,4,5,6-tetrachlorophthalonitrile (1.76 g), phthalonitrile (0.42 g), 1,8-diazabicycloundec-7-ene (2.52 g), and 1-pentenol (15 g) were put in a 100 ml flask and were heated to 90° C. to dissolve the solids, zinc acetate (0.61 g) was added, and the resultant was stirred while heating to 140° C. When the reaction was complete, methanol was used for a precipitation, and a precipitate therefrom was filtered and vacuum-dried. The dried solid was purified through column chromatography. Dichloromethane was appropriately added to the purified solid and dissolve it, and methanol was added thereto to crystallize it. The crystallized solid was filtered and vacuum-dried to obtain a compound represented by Chemical Formula 1-19.

[Chemical Formula 1-19]

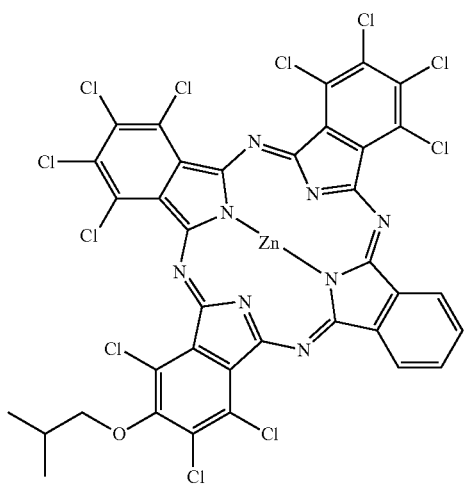

MALDI-TOF MS: 1028.89 m/z

Synthesis Example 20: Synthesis of Compound Represented by Chemical Formula 1-20

4-(2-methyl-1-propoxy)-3,5,6-trichloro-phthalonitrile (2 g), phthalonitrile (0.85 g), 1,8-diazabicycloundec-7-ene (2.52 g), and 1-pentenol (15 g) were put in a 100 ml flask and were heated to 90° C. to dissolve the solids, zinc acetate (0.61 g) was added, and the resultant was stirred while heating to 140° C. When the reaction was complete, methanol was used for a precipitation, and a precipitate therefrom was filtered and vacuum-dried. The dried solid was purified through column chromatography. Dichloromethane was appropriately added to the purified solid and dissolve it, and methanol was added thereto to crystallize it. The crystallized solid was filtered and vacuum-dried to obtain a compound represented by Chemical Formula 1-20.

[Chemical Formula 1-20]

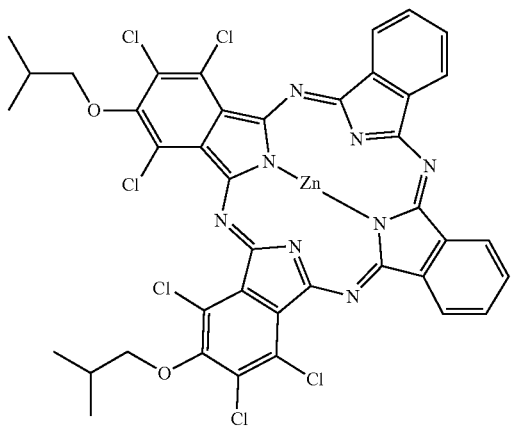

MALDI-TOF MS: 928.78 m/z

Synthesis Example 21: Synthesis of Compound Represented by Chemical Formula 1-21

4-(2,4-di-t-butyl-phenoxy)-3,5,6-trichloro-phthalonitrile (2 g), phthalonitrile (2.03 g), 1,8-diazabicycloundec-7-ene (4.01 g), and 1-pentenol (15 g) were put in a 100 ml flask and were heated to 90° C. to dissolve the solids, zinc acetate (0.97 g) was added, and the resultant was stirred while heating to 140° C. When the reaction was complete, methanol was used for a precipitation, and a precipitate therefrom was filtered and vacuum-dried. The dried solid was purified through column chromatography. Dichloromethane was appropriately added to the purified solid and dissolve it, and methanol was added thereto to crystallize it. The crystallized solid was filtered and vacuum-dried to obtain a compound represented by Chemical Formula 1-21.

[Chemical Formula 1-21]

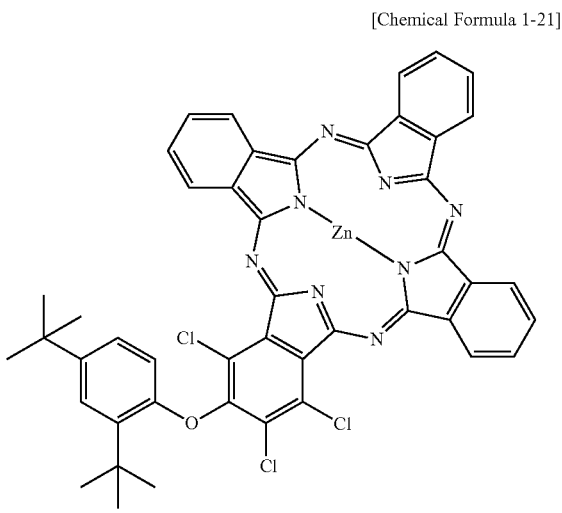

MALDI-TOF MS: 885.56 m/z

Comparative Synthesis Example 1: Synthesis of Compound Represented by Chemical Formula C-1

4-(2-sec-butyl-phenoxy)-3,5,6-trichloro-phthalonitrile (1 g), 1,8-diazabicycloundec-7-ene (0.30 g), 1-pentenol (7 g), and zinc acetate (0.12 g) were put in a 100 mL flask and stirred, while heated at 140° C. When the reaction was complete, the resultant was concentrated and purified through column chromatography. The purified liquid was concentrated to obtain a solid. The crystallized solid was vacuum-dried to obtain a compound represented by Chemical Formula C-1.

[Chemical Formula C-1]

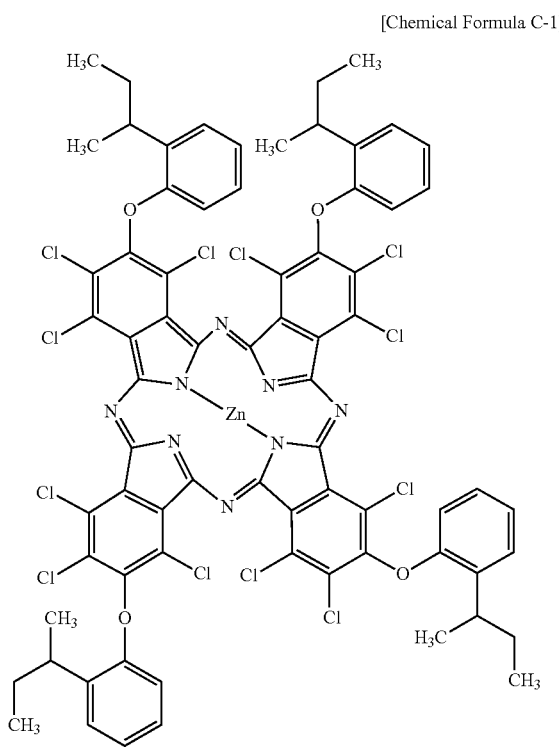

MALDI-TOF MS: 1584.04 m/z

Comparative Synthesis Example 2: Synthesis of Compound Represented by Chemical Formula C-2

3,4,5,6-tetrachlorophthalonitrile (5 g), 2,4-di-tert-butylphenol (2.75 g), K₂CO₃ (3.9 g), and N,N-dimethyl formamide (25 ml) were put in a 100 ml flask and then, stirred while heated at 70° C. When the reaction was complete, EA (ethyl acetate) was used for an extraction. After the extraction, the resultant was concentrated to obtain a solid. The obtained solid was dissolved in a small amount of dichloromethane, washed several times with hexane, filtered, and vacuum-dried to obtain 3,4,6-trichloro-5-(2,4-dimethyl-phenoxy)-phthalonitrile.

3,4,6-trichloro-5-(2,4-di-tert-butyl-phenoxy)-phthalonitrile (1 g), 1,8-diazabicycloundec-7-ene (1.08 g), and 1-pentenol (14 g) were put in a 100 ml flask and were heated to 90° C. to dissolve the solids, zinc acetate (0.26 g) was added, and the resultant was stirred while heating to 140° C. When the reaction was complete, methanol was used for a precipitation, and a precipitate therefrom was filtered and vacuum-dried. The dried solid was purified through column chromatography. Dichloromethane was appropriately added to the purified solid and dissolve it, and methanol was added thereto to crystallize it. The crystallized solid was filtered and vacuum-dried to obtain a compound represented by Chemical Formula C-2.

[Chemical Formula C-2]

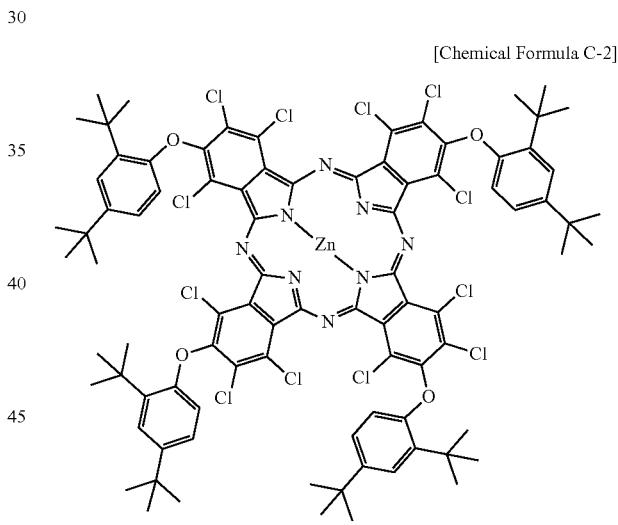

MALDI-TOF MS: 1808.47 m/z

Comparative Synthesis Example 3: Synthesis of Compound Represented by Chemical Formula C-3

3,4,5,6-tetrachlorophthalonitrile (5 g), 2,4-dimethoxyphenol (3.47 g), K₂CO₃ (3.9 g), and N,N-dimethyl formamide (25 ml) were put in a 100 ml flask and stirred while heated at 70° C. When the reaction was complete, EA (ethyl acetate) was used for an extraction. After the extraction, the resultant was concentrated to obtain a solid. The obtained solid was dissolved in a small amount of dichloromethane, washed several times with hexane, filtered, and vacuum-dried to obtain 3,4,6-trichloro-5-(2,4-dimethoxy-phenoxy)-phthalonitrile.

3,4,6-trichloro-5-(2,4-dimethoxy-phenoxy)-phthalonitrile (2 g), 1,8-diazabicycloundec-7-ene (0.99 g) and 1-pentenol (14 g) were put in a 100 ml flask and were heated to 90° C. to dissolve the solids, zinc acetate (0.24 g) was added, and the resultant was stirred while heating to 140° C. When the reaction was complete, methanol was used for a precipitation, and a precipitate therefrom was filtered and vacuum-dried. The dried solid was purified through column chromatography. Dichloromethane was appropriately added to the purified solid and dissolve it, and methanol was added thereto to crystallize it. The crystallized solid was filtered and vacuum-dried to obtain a compound represented by Chemical Formula C-3.

[Chemical Formula C-3]

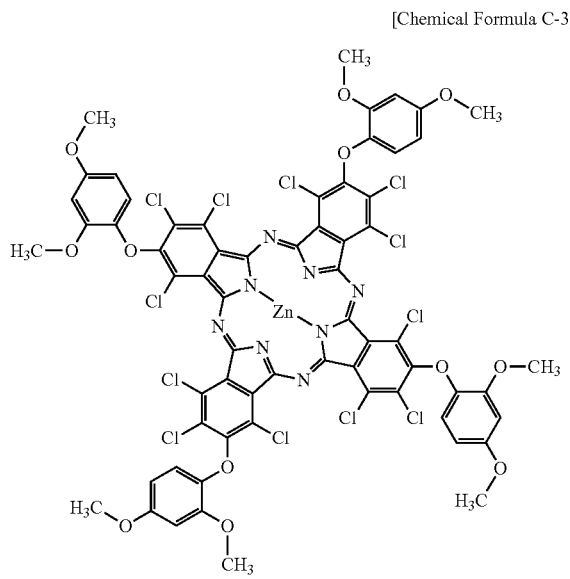

MALDI-TOF MS: 1591.80 m/z

Comparative Synthesis Example 4: Synthesis of Compound Represented by Chemical Formula C-4

4-(2,4-dimethoxy-phenoxy)-3,5,6-trichloro-phthalonitrile of Synthesis Example 1-2 (0.7 g), 3,4,5,6-tetrachlorophthalonitrile (1.45 g), 1,8-diazabicycloundec-7-ene (1.38 g), and 1-pentenol (14 g) were put in a 100 ml flask and were heated to 90° C. to dissolve the solids, zinc acetate (0.33 g) was added, and the resultant was stirred while heating to 140° C. When the reaction was complete, methanol was used for a precipitation, and a precipitate therefrom was filtered and vacuum-dried. The dried solid was purified through column chromatography. Dichloromethane was appropriately added to the purified solid and dissolve it, and methanol was added thereto to crystallize it. The crystallized solid was filtered and vacuum-dried to obtain a compound represented by Chemical Formula C-4.

[Chemical Formula C-4]

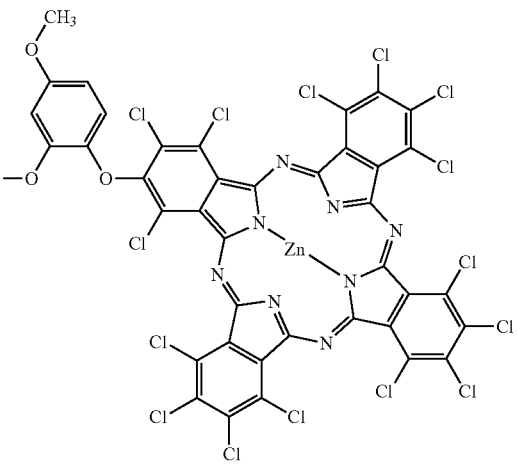

MALDI-TOF MS: 1237.54 m/z

Comparative Synthesis Example 5: Synthesis of Compound Represented by Chemical Formula C-5

4-(2-tert-butyl-phenoxy)-3,5,6-trichloro-phthalonitrile (2 g), 3,4,5,6-tetrachlorophthalonitrile (0.70 g), 4,5-dichlorophthalonitrile (0.52 g), 1,8-diazabicycloundec-7-ene (2.01 g), and 1-pentenol (15 g) were put in a 100 ml flask and were heated to 90° C. to dissolve the solids, zinc acetate (0.48 g) was added, and the resultant was stirred while heating to 140° C. When the reaction was complete, methanol was used for a precipitation, and a precipitate therefrom was filtered and vacuum-dried. The dried solid was purified through column chromatography. Dichloromethane was appropriately added to the purified solid and dissolve it, and methanol was added thereto to crystallize it. The crystallized solid was filtered and vacuum-dried to obtain a compound represented by Chemical Formula C-5.

[Chemical Formula C-5]

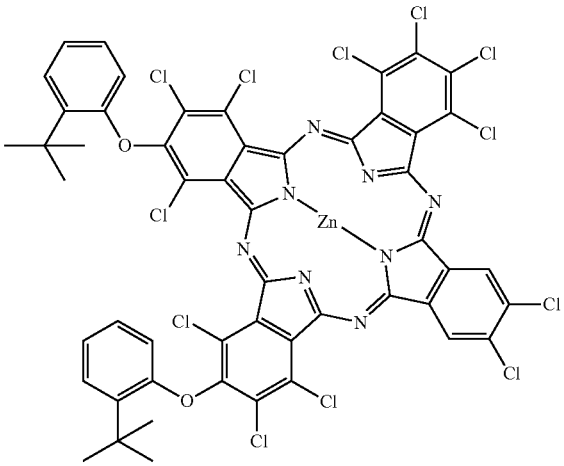

MALDI-TOF MS: 1287.63 m/z

Comparative Synthesis Example 6. Synthesis of Compound Represented by Chemical Formula C-6

4-(2-tert-butyl-phenoxy)-3,5,6-trichloro-phthalonitrile (2 g), 3,4,5,6-tetrachlorophthalonitrile (0.70 g), 4-dichlorophthalonitrile (0.43 g), 1,8-diazabicycloundec-7-ene (2.01 g) and 1-pentenol (15 g) were put in a 100 ml flask and were heated to 90° C. to dissolve the solids, zinc acetate (0.48 g) was added, and the resultant was stirred while heating to 140° C. When the reaction was complete, methanol was used for a precipitation, and a precipitate therefrom was filtered and vacuum-dried. The dried solid was purified through column chromatography. Dichloromethane was appropriately added to the purified solid and dissolve it, and methanol was added thereto to crystallize it. The crystallized solid was filtered and vacuum-dried to obtain a compound represented by Chemical Formula C-6.

[Chemical Formula C-6]

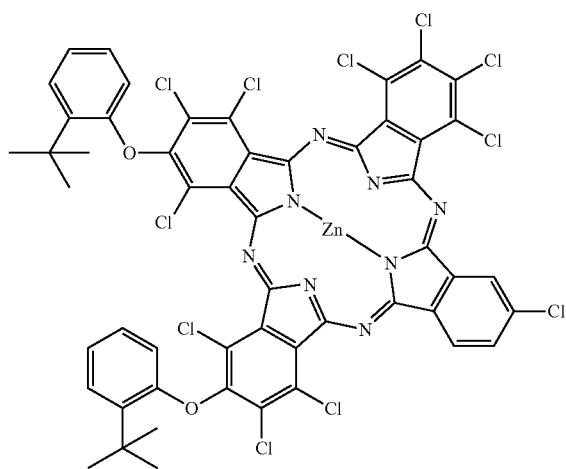

MALDI-TOF MS: 1253.19 m/z

Evaluation 1: Measurement of the Shortest Wavelength of Full Width at Half Maximum (FWHM) with respect to Maximum Absorption Wavelength The compounds according to Synthesis Example 1 to Synthesis Example 21 and Comparative Synthesis Example 1 to Comparative Synthesis Example 6 were prepared at a concentration of 0.005 wt % using a diluting solvent (PGMEA). Absorption spectra were obtained for each of the phthalocyanine compounds according to Synthesis Example 1 to Synthesis Example 20 and Comparative Synthesis Example 1 to Comparative Synthesis Example 6, and the results are shown in Table 1 (UV-1800, SHTMADZU).

TABLE 1

| | The shortest wavelength (nm) of full width at half maximum (FWHM) with respect to maximum absorption wavelength |
|---|---|
| Synthesis Example 1 | 616 |
| Synthesis Example 2 | 617 |
| Synthesis Example 3 | 618 |
| Synthesis Example 4 | 617 |
| Synthesis Example 5 | 618 |
| Synthesis Example 6 | 618 |
| Synthesis Example 7 | 618 |
| Synthesis Example 8 | 616 |
| Synthesis Example 9 | 618 |
| Synthesis Example 10 | 616 |
| Synthesis Example 11 | 611 |
| Synthesis Example 12 | 617 |
| Synthesis Example 13 | 618 |
| Synthesis Example 14 | 611 |
| Synthesis Example 15 | 617 |
| Synthesis Example 16 | 618 |
| Synthesis Example 17 | 611 |
| Synthesis Example 18 | 617 |
| Synthesis Example 19 | 618 |
| Synthesis Example 20 | 611 |
| Synthesis Example 21 | 608 |
| Comparative Synthesis Example 1 | 628 |
| Comparative Synthesis Example 2 | 624 |
| Comparative Synthesis Example 3 | 623 |
| Comparative Synthesis Example 4 | 626 |
| Comparative Synthesis Example 5 | 625 |
| Comparative Synthesis Example 6 | 623 |

Evaluation 2: Solubility Measurement

Solubility of the compounds according to Synthesis Examples 11 to 21 and Comparative Synthesis Examples 1 to 6 were measured by adding a dilution solvent (PGMEA) to 0.5 g of each compound and respectively stirring the mixtures (MIXROTAR VMR-5, Iuchi Seiei Dou Co.) at 100 rpm for one hour at 25° C., and the results are shown in Table 2.

Solubility Evaluation Criteria

Greater than or equal to 10 wt % of a compound (a solute) based on a total amount of a diluting solvent was dissolved: ○

Less than 10 wt % of a compound (a solute) based on a total amount of a diluting solvent was dissolved: X

TABLE 2

| | Solubility |
|---|---|
| Synthesis Example 1 | ○ |
| Synthesis Example 2 | ○ |
| Synthesis Example 3 | ○ |
| Synthesis Example 4 | ○ |
| Synthesis Example 5 | ○ |
| Synthesis Example 6 | ○ |
| Synthesis Example 7 | ○ |
| Synthesis Example 8 | ○ |
| Synthesis Example 9 | ○ |
| Synthesis Example 10 | ○ |
| Synthesis Example 11 | ○ |
| Synthesis Example 12 | ○ |
| Synthesis Example 13 | ○ |
| Synthesis Example 14 | ○ |
| Synthesis Example 15 | ○ |
| Synthesis Example 16 | ○ |
| Synthesis Example 17 | ○ |
| Synthesis Example 18 | ○ |
| Synthesis Example 19 | ○ |
| Synthesis Example 20 | ○ |
| Synthesis Example 21 | X |
| Comparative Synthesis Example 1 | X |

TABLE 2-continued

| | Solubility |
|---|---|
| Comparative Synthesis Example 2 | X |
| Comparative Synthesis Example 3 | X |
| Comparative Synthesis Example 4 | X |
| Comparative Synthesis Example 5 | X |
| Comparative Synthesis Example 6 | X |

Referring to Table 2, the compounds of Synthesis Examples 1 to 20 exhibited excellent solubility for an organic solvent, compared with the compounds according to Synthesis Example 21 and Comparative Synthesis Examples 1 to 6, and thus excellent color characteristics, when used for a photosensitive resin composition and the like.

(Synthesis of Photosensitive Resin Compositions)

Example 1

The components mentioned below were mixed in the compositions shown in Tables 3 to 5 to prepare each photosensitive resin composition according to Examples 1 to 21 and Comparative Examples 1 to 6.

Specifically, a photopolymerization initiator was dissolved in a solvent, the solution was stirred at room temperature for 2 hours, a binder resin and a photopolymerizable monomer were added thereto, and the mixture was stirred at ambient temperature for 2 hours. Subsequently, the compounds (dye) prepared in the Synthesis Examples (Syn. Ex.) and Comparative Synthesis Examples (Comp. Syn. Ex.) and a pigment (pigment dispersion) as a colorant were added to the reactants, and the mixture was stirred at ambient temperature for one hour. Then, an antioxidant and a leveling agent were added, and the product was filtered three times to remove impurities, thereby preparing each photosensitive resin composition.

TABLE 3

(unit: wt %)

| | | Examples | | | | | | | | | |
|---|---|---|---|---|---|---|---|---|---|---|---|
| | | 1 | 2 | 3 | 4 | 5 | 6 | 7 | 8 | 9 | 10 |
| Binder resin | EHPE-3150 (DAICEL, epoxy) | 0.27 | 0.27 | 0.27 | 0.27 | 0.27 | 0.27 | 0.27 | 0.27 | 0.27 | 0.27 |
| | NPR-5216 (Miwon, acryl) | 7.91 | 7.91 | 7.91 | 7.91 | 7.91 | 7.91 | 7.91 | 7.91 | 7.91 | 7.91 |
| Photopolymerizable monomer | GM66G0P (QPPC) | 4.92 | 4.92 | 4.92 | 4.92 | 4.92 | 4.92 | 4.92 | 4.92 | 4.92 | 4.92 |
| | Miramer 2200 (Miwon) | 0.37 | 0.37 | 0.37 | 0.37 | 0.37 | 0.37 | 0.37 | 0.37 | 0.37 | 0.37 |
| Photopolymerization initiator | SPI-03 (Samyang Corporation) | 0.78 | 0.78 | 0.78 | 0.78 | 0.78 | 0.78 | 0.78 | 0.78 | 0.78 | 0.78 |
| | IRG369 (BASF) | 0.01 | 0.01 | 0.01 | 0.01 | 0.01 | 0.01 | 0.01 | 0.01 | 0.01 | 0.01 |
| Antioxidant | AO-80 (ADEKA) | 0.01 | 0.01 | 0.01 | 0.01 | 0.01 | 0.01 | 0.01 | 0.01 | 0.01 | 0.01 |
| Pigment | G58 pigment dispersion (SANYO, AG1623) | 3.00 | 3.00 | 3.00 | 3.00 | 3.00 | 3.00 | 3.00 | 3.00 | 3.00 | 3.00 |
| | Y138 pigment dispersion (ENF, EC-1200Y) | 17.79 | 17.79 | 17.79 | 17.79 | 17.79 | 17.79 | 17.79 | 17.79 | 17.79 | 17.79 |
| | Dye | 30.22 Syn. Ex. 1 | 30.22 Syn. Ex. 2 | 30.22 Syn. Ex. 3 | 30.22 Syn. Ex. 4 | 30.22 Syn. Ex. 5 | 30.22 Syn. Ex. 6 | 30.22 Syn. Ex. 7 | 30.22 Syn. Ex. 8 | 30.22 Syn. Ex. 9 | 30.22 Syn. Ex. 10 |
| Solvent | PGMEA (DAICEL) | 34.50 | 34.50 | 34.50 | 34.50 | 34.50 | 34.50 | 34.50 | 34.50 | 34.50 | 34.50 |
| Leveling agent | F554 (DIC) | 0.20 | 0.20 | 0.20 | 0.20 | 0.20 | 0.20 | 0.20 | 0.20 | 0.20 | 0.20 |
| | Total | 100 | 100 | 100 | 100 | 100 | 100 | 100 | 100 | 100 | 100 |

TABLE 4

(unit: wt %)

| | | Examples | | | | | | | | | |
|---|---|---|---|---|---|---|---|---|---|---|---|
| | | 11 | 12 | 13 | 14 | 15 | 16 | 17 | 18 | 19 | 20 |
| Binder resin | EHPE-3150 (DAICEL, epoxy) | 0.27 | 0.27 | 0.27 | 0.27 | 0.27 | 0.27 | 0.27 | 0.27 | 0.27 | 0.27 |
| | NPR-5216 (Miwon, acryl) | 7.91 | 7.91 | 7.91 | 7.91 | 7.91 | 7.91 | 7.91 | 7.91 | 7.91 | 7.91 |
| Photopolymerizable monomer | GM66G0P (QPPC) | 4.92 | 4.92 | 4.92 | 4.92 | 4.92 | 4.92 | 4.92 | 4.92 | 4.92 | 4.92 |
| | Miramer 2200 (Miwon) | 0.37 | 0.37 | 0.37 | 0.37 | 0.37 | 0.37 | 0.37 | 0.37 | 0.37 | 0.37 |
| Photopolymerization initiator | SPI-03 (Samyang Corporation) | 0.78 | 0.78 | 0.78 | 0.78 | 0.78 | 0.78 | 0.78 | 0.78 | 0.78 | 0.78 |
| | IRG369 (BASF) | 0.01 | 0.01 | 0.01 | 0.01 | 0.01 | 0.01 | 0.01 | 0.01 | 0.01 | 0.01 |
| Antioxidant | AO-80 (ADEKA) | 0.01 | 0.01 | 0.01 | 0.01 | 0.01 | 0.01 | 0.01 | 0.01 | 0.01 | 0.01 |
| Pigment | G58 pigment dispersion (SANYO, AG1623) | 3.00 | 3.00 | 3.00 | 3.00 | 3.00 | 3.00 | 3.00 | 3.00 | 3.00 | 3.00 |
| | Y138 pigment dispersion (ENF, EC-1200Y) | 17.79 | 17.79 | 17.79 | 17.79 | 17.79 | 17.79 | 17.79 | 17.79 | 17.79 | 17.79 |

TABLE 4-continued (unit: wt %)

|  |  | Examples | | | | | | | | | |
|---|---|---|---|---|---|---|---|---|---|---|---|
|  |  | 11 | 12 | 13 | 14 | 15 | 16 | 17 | 18 | 19 | 20 |
|  | Dye | 30.22 Syn. Ex. 11 | 30.22 Syn. Ex. 12 | 30.22 Syn. Ex. 13 | 30.22 Syn. Ex. 14 | 30.22 Syn. Ex. 15 | 30.22 Syn. Ex. 16 | 30.22 Syn. Ex. 17 | 30.22 Syn. Ex. 18 | 30.22 Syn. Ex. 19 | 30.22 Syn. Ex. 20 |
| Solvent | PGMEA (DAICEL) | 34.50 | 34.50 | 34.50 | 34.50 | 34.50 | 34.50 | 34.50 | 34.50 | 34.50 | 34.50 |
| Leveling agent | F554 (DIC) | 0.20 | 0.20 | 0.20 | 0.20 | 0.20 | 0.20 | 0.20 | 0.20 | 0.20 | 0.20 |
|  | Total | 100 | 100 | 100 | 100 | 100 | 100 | 100 | 100 | 100 | 100 |

TABLE 5

(unit: wt %)

|  |  |  | Comparative Examples | | | | | |
|---|---|---|---|---|---|---|---|---|
|  |  | Example 21 | 1 | 2 | 3 | 4 | 5 | 6 |
| Binder resin | EHPE-3150 (DAICEL, epoxy) | 0.27 | 0.27 | 0.27 | 0.27 | 0.27 | 0.27 | 0.27 |
|  | NPR-5216 (Miwon, acryl) | 7.91 | 7.91 | 7.91 | 7.91 | 7.91 | 7.91 | 7.91 |
| Photopolymerizable monomer | GM66G0P (QPPC) | 4.92 | 4.92 | 4.92 | 4.92 | 4.92 | 4.92 | 4.92 |
|  | Miramer 2200 (Miwon) | 0.37 | 0.37 | 0.37 | 0.37 | 0.37 | 0.37 | 0.37 |
| Photopolymerization initiator | SPI-03 (Samyang Corporation) | 0.78 | 0.78 | 0.78 | 0.78 | 0.78 | 0.78 | 0.78 |
|  | IRG369 (BASF) | 0.01 | 0.01 | 0.01 | 0.01 | 0.01 | 0.01 | 0.01 |
| Antioxidant | AO-80 (ADEKA) | 0.01 | 0.01 | 0.01 | 0.01 | 0.01 | 0.01 | 0.01 |
| Pigment | G58 pigment dispersion (SANYO AG1623) | 3.00 | 3.00 | 3.00 | 3.00 | 3.00 | 3.00 | 3.00 |
|  | Y138 pigment dispersion (ENF, EC-1200Y) | 17.79 | 17.79 | 17.79 | 17.79 | 17.79 | 17.79 | 17.79 |
|  | Dye | 30.22 Syn. Ex. 21 | 30.22 Comp. Syn. Ex. 1 | 30.22 Comp. Syn. Ex. 2 | 30.22 Comp. Syn. Ex. 3 | 30.22 Comp. Syn. Ex. 4 | 30.22 Comp. Syn. Ex. 5 | 30.22 Comp. Syn. Ex. 6 |
| Solvent | PGMEA (DAICEL) | 34.50 | 34.50 | 34.50 | 34.50 | 34.50 | 34.50 | 34.50 |
| Leveling agent | F554 (DIC) | 0.20 | 0.20 | 0.20 | 0.20 | 0.20 | 0.20 | 0.20 |
|  | Total | 100 | 100 | 100 | 100 | 100 | 100 | 100 |

Evaluation 3: Color Coordinates, Luminance, Chemical Resistance, Developability, and Surface Wrinkles The photosensitive resin compositions according to Example 1 to Example 21 and Comparative Example 1 to Comparative Example 6 were respectively coated to be 1 μm to 3 μm thick on a 1 mm-thick degreased glass substrate and then, dried on a 90° C. hot plate for 2 minutes to obtain films. The films were exposed by using a high pressure mercury lamp having a main wavelength of 365 nm. Subsequently, the films were dried in a 230° C. forced convection drying furnace for 20 minutes to obtain samples. For pixel layers, the C light source reference color purity was evaluated using a spectrophotometer (MCPD3000, Otsuka Electronic Co., Ltd.), and luminance (Y) was calculated using the CIE color coordinate reference, and the results are shown in Table 6.

In addition, after measuring initial thicknesses of the samples obtained through the exposure and the drying (photoresist layers), the samples were allowed to stand in an NMP solvent at 25° C. for 10 minutes, washed with ultra-pure water for 30 seconds, and blown dry by compressed air. Subsequently, the spectrophotometer was used to measure del(E*) thereof and thus evaluate chemical resistance, and the results are shown in Table 6.

After the coating and the exposure, developability of the samples was examined by using a developing machine (Scientific Vacuum Systems (SVS) Ltd., a KOH diluted solution), and the results are shown in Table 6.

After drying the developed substrates in a 230° C. forced convection drying furnace for 20 minutes, surface wrinkles of the obtained samples were examined with a scanning electron microscope, and the results are shown in Table 6.

Criteria for Evaluation of Chemical Resistance
del(E*) was less than 3: ○
del(E*) was greater than or equal to 3: X
Criteria for Evaluation of Developability
BP was less than 60 seconds: ○
BP was greater than or equal to 60 seconds: X
Criteria for Evaluation of Surface Wrinkle
No wrinkles were observed on the pattern surface when observed with a scanning electron microscope: ○
Wrinkles were observed on the pattern surface when observed with a scanning electron microscope: X

TABLE 6

| | CIE color coordinate (Gx, Gy) | Luminance (%) | Chemical resistance | Developability | Surface wrinkle |
|---|---|---|---|---|---|
| Example 1 | 0.255, 0.560 | 61.7 | ○ | O | O |
| Example 2 | 0.254, 0.560 | 61.8 | ○ | O | O |
| Example 3 | 0.255, 0.560 | 61.4 | ○ | O | O |
| Example 4 | 0.256, 0.560 | 61.5 | ○ | O | O |
| Example 5 | 0.254, 0.560 | 61.6 | ○ | O | O |
| Example 6 | 0.253, 0.560 | 61.7 | ○ | O | O |
| Example 7 | 0.255, 0.560 | 61.3 | ○ | O | O |
| Example 8 | 0.254, 0.560 | 61.9 | ○ | O | O |
| Example 9 | 0.252, 0.560 | 61.8 | ○ | O | O |
| Example 10 | 0.253, 0.560 | 61.6 | ○ | O | O |
| Example 11 | 0.254, 0.560 | 61.4 | ○ | O | O |
| Example 12 | 0.255, 0.560 | 61.2 | ○ | O | O |
| Example 13 | 0.253, 0.560 | 61.1 | ○ | O | O |
| Example 14 | 0.254, 0.560 | 61.3 | ○ | O | O |
| Example 15 | 0.255, 0.560 | 61.4 | ○ | O | O |
| Example 16 | 0.250, 0.560 | 61.8 | ○ | O | O |
| Example 17 | 0.251, 0.560 | 61.3 | ○ | O | O |
| Example 18 | 0.254, 0.560 | 61.2 | ○ | O | O |
| Example 19 | 0.255, 0.560 | 61.3 | ○ | O | O |
| Example 20 | 0.253, 0.560 | 61.5 | ○ | O | O |
| Example 21 | 0.253, 0.560 | 59.7 | X | X | X |
| Comparative Example 1 | 0.274, 0.560 | 60.1 | X | X | X |
| Comparative Example 2 | 0.273, 0.560 | 60.0 | X | O | X |
| Comparative Example 3 | 0.272, 0.560 | 58.8 | X | X | X |
| Comparative Example 4 | 0.276, 0.560 | 59.8 | X | X | O |
| Comparative Example 5 | 0.275, 0.560 | 59.1 | X | X | X |
| Comparative Example 6 | 0.275, 0.560 | 58.1 | X | X | X |

Referring to Table 6, the photosensitive resin compositions according to Examples 1 to 20, compared with the photosensitive resin compositions (not including the phthalocyanine compound) according to Comparative Examples 1 to 6, reproduced high colors and simultaneously, exhibited excellent luminance and chemical resistance and thus provided a high definition display having excellent color characteristics when easily applied to an image sensor and the like. The photosensitive resin composition of Example 21 reproduced high colors, but luminance, chemical resistance, developability, surface wrinkle characteristics, and the like thereof were greatly deteriorated, compared with those of photosensitive resin compositions of Examples 1 to 20.

By way of summation and review, a pigment dispersion method that is one of methods of forming a color filter may provide a colored thin film by repeating a series of processes such as coating a photopolymerizable composition including a colorant on a transparent substrate including a black matrix, exposing a formed pattern to light, removing a non-exposed part with a solvent, and thermally curing the same. A photosensitive resin composition used for producing a color filter according to the pigment dispersion method may include an alkali soluble resin, a photopolymerization monomer, a photopolymerization initiator, an epoxy resin, a solvent, other additives, and the like. The pigment dispersion method may be applied to produce an LCD such as a mobile phone, a laptop, a monitor, and TV. A photosensitive resin composition for a color filter for the pigment dispersion method has recently required improved performance as well as excellent pattern profiles. For example, there is a growing demand for colorants applicable to image sensors that require high color reproducibility and high luminance and high contrast ratio characteristics.

The image sensors are image sensor parts producing images in a display device such as a cell phone camera, a digital still camera (DSC), and the like and may be classified into charge coupled device (CCD) image sensors and complementary metal oxide semiconductor (CMOS) image sensors.

The charge coupled device (CCD) image sensors may use a photosensitive resin layer for a color filter, which requires a film thickness of less than or equal to about 1.5 μm, the photosensitive resin composition may be prepared by including a large amount of the colorants, and may have insufficient adhesion to a substrate or insufficient curing due to deteriorated sensitivity, significant deterioration of pattern formability such as a color loss due to elution of the dyes in an exposed region, and the like.

A photosensitive resin composition for a color filter providing good luminance, chemical resistance, and the like and simultaneously, realizing high colors and thus applicable to image sensors has been considered.

One or more embodiments may provide a compound capable of implementing a high-definition color filter.

The compound according to an embodiment may have excellent green spectral characteristics, a high molar extinction coefficient, and excellent solubility in an organic solvent and thus may be used as a dye for a green photosensitive resin composition for a color filter, and accordingly, a photosensitive resin layer and a color filter produced by using the photosensitive resin composition including the dye may have excellent luminance and contrast ratio.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A phthalocyanine compound exhibiting a shortest wavelength of a full width at half maximum (FWHM) with respect to a maximum absorption wavelength in a range of about 600 nm to about 620 nm, wherein:
the phthalocyanine compound is represented by Chemical Formula 1:

[Chemical Formula 1]

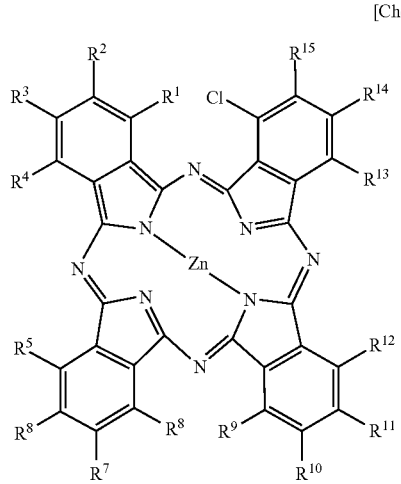

in Chemical Formula 1,
$R^1$ to $R^4$ are each a hydrogen atom,
$R^5$ to $R^8$ are each independently a hydrogen atom or a halogen atom, and
$R^9$ to $R^{16}$ are each independently a halogen atom or a group represented by Chemical Formula 2, at least one of $R^9$ to $R^{16}$ being a group represented by Chemical Formula 2,

*—O—R$^{17}$  [Chemical Formula 2]

in Chemical Formula 2, $R^{17}$ is a substituted or unsubstituted C1 to C20 alkyl group or an alkyl-substituted or unsubstituted C6 to C20 aryl group.

2. The compound as claimed in claim 1, wherein:
the group represented by Chemical Formula 2 is represented by one of Chemical Formula 2-1 to Chemical Formula 2-4:

[Chemical Formula 2-1]

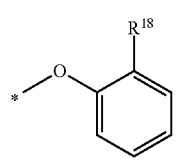

[Chemical Formula 2-2]

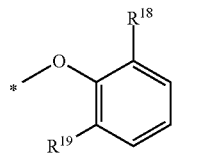

[Chemical Formula 2-3]

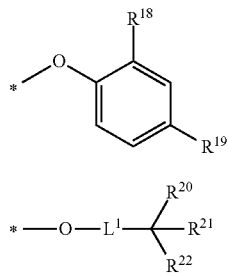

[Chemical Formula 2-4]

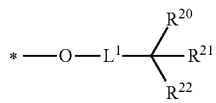

in Chemical Formula 2-1 to Chemical Formula 2-4,
$R^{18}$ and $R^{19}$ are each independently an unsubstituted C1 to C20 alkyl group,
$R^{20}$ to $R^{22}$ are each independently a hydrogen atom or a substituted or unsubstituted C1 to C20 alkyl group, and
$L^1$ is a substituted or unsubstituted C1 to C20 alkylene group.

3. The compound as claimed in claim 1, wherein one of $R^9$ to $R^{16}$ is a group represented by Chemical Formula 2 and remaining ones of $R^9$ to $R^{16}$ are a halogen atom.

4. The compound as claimed in claim 3, wherein:
one of $R^9$ to $R^{12}$ is a group represented by Chemical Formula 2 and remaining ones of $R^9$ to $R^{16}$ are a halogen atom, or
one of $R^{13}$ to $R^{16}$ is a group represented by Chemical Formula 2 and remaining ones of $R^9$ to $R^{16}$ are a halogen atom.

5. The compound as claimed in claim 4, wherein one of $R^{10}$, $R^{11}$, $R^{14}$, and $R^{15}$ is a group represented by Chemical Formula 2 and remaining ones of $R^9$ to $R^{16}$ are a halogen atom.

6. The compound as claimed in claim 1, wherein two of $R^9$ to $R^{16}$ are groups represented by Chemical Formula 2 and remaining ones of $R^9$ to $R^{16}$ are a halogen atom.

7. The compound as claimed in claim 6, wherein:
one of $R^9$ to $R^{12}$ is a group represented by Chemical Formula 2 and remaining ones of $R^9$ to $R^{12}$ are a halogen atom, and
one of $R^{13}$ to $R^{16}$ is a group represented by Chemical Formula 2 and remaining ones of $R^{13}$ to $R^{16}$ are a halogen atom.

8. The compound as claimed in claim 7, wherein:
one of $R^{10}$ and $R^{11}$ is a group represented by Chemical Formula 2 and remaining ones of $R^9$ to $R^{12}$ are a halogen atom, and
one of $R^{14}$ and $R^{15}$ is a group represented by Chemical Formula 2 and remaining ones of $R^{13}$ to $R^{16}$ are a halogen atom.

9. The compound as claimed in claim 1, wherein the compound represented by Chemical Formula 1 is a compound represented by one of Chemical Formula 1-1 to Chemical Formula 1-20:

[Chemical Formula 1-1]
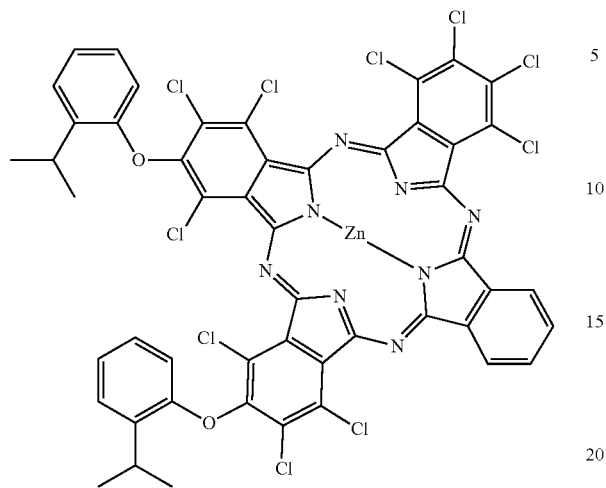
[Chemical Formula 1-2]
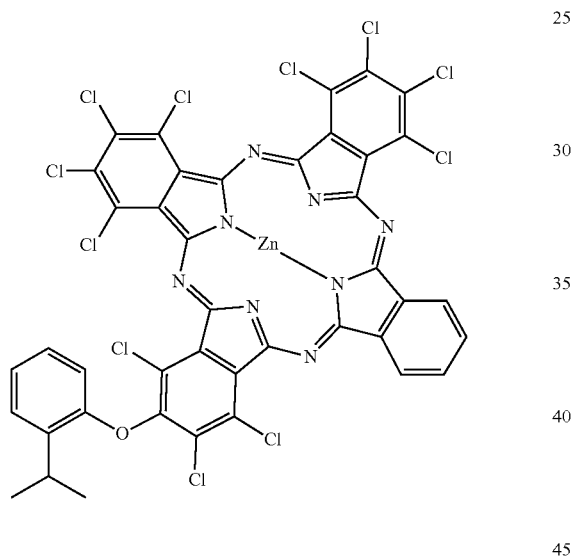
[Chemical Formula 1-3]
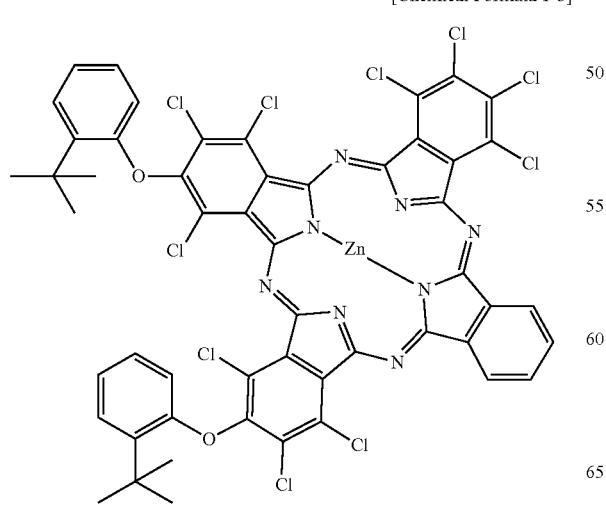
[Chemical Formula 1-4]
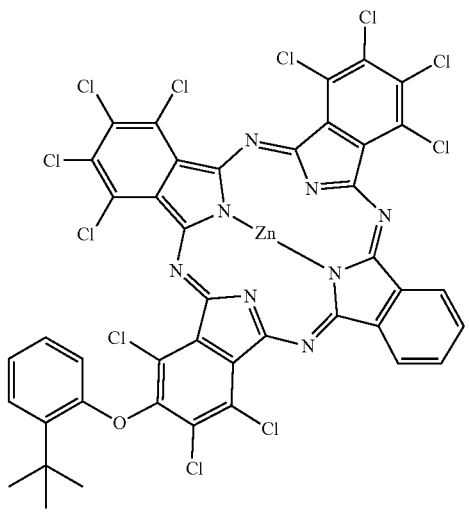
[Chemical Formula 1-5]
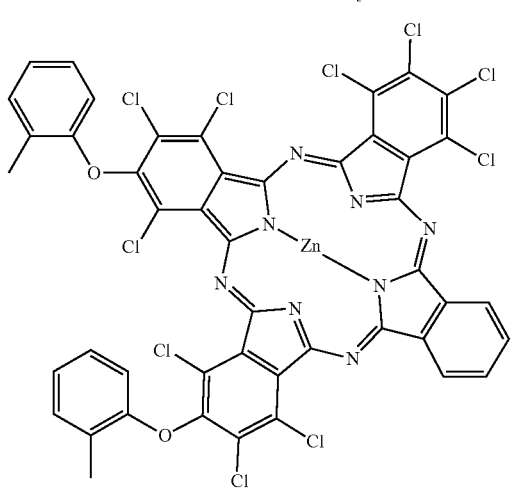
[Chemical Formula 1-6]
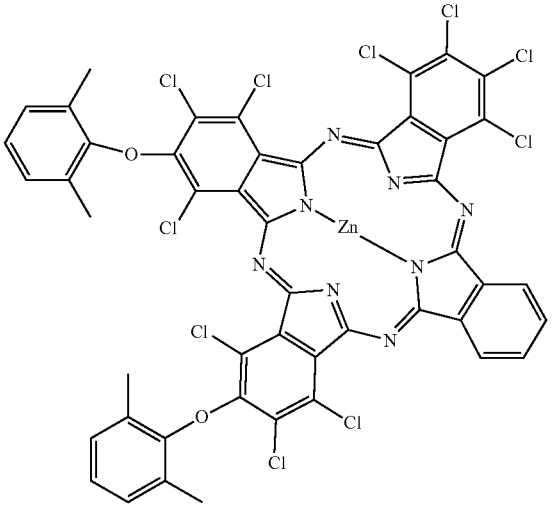

[Chemical Formula 1-7]
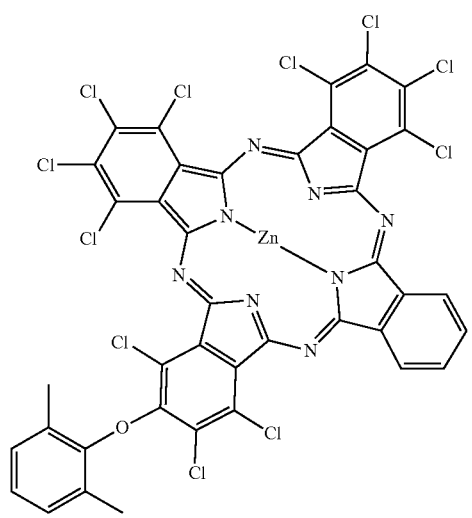
[Chemical Formula 1-8]
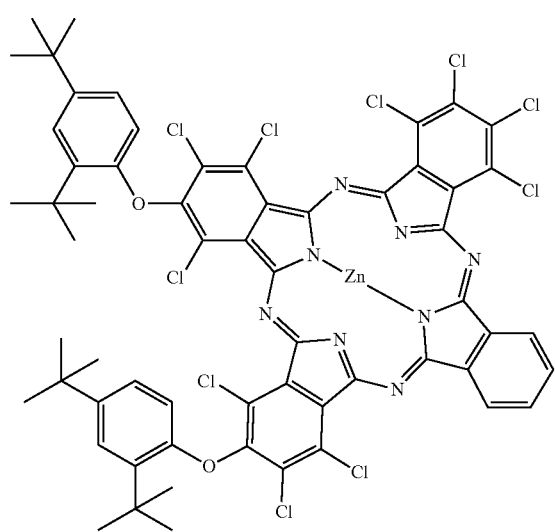
[Chemical Formula 1-9]
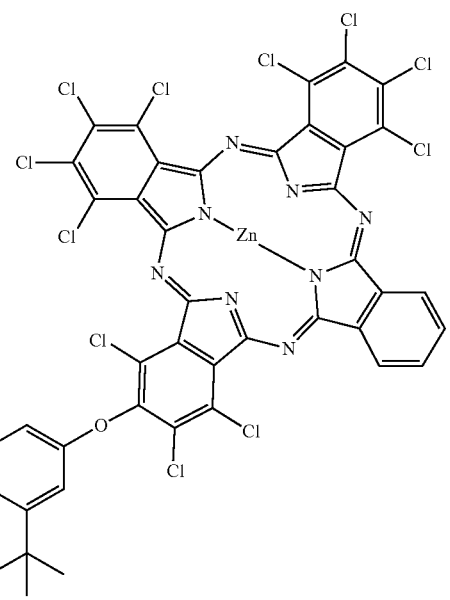
[Chemical Formula 1-10]
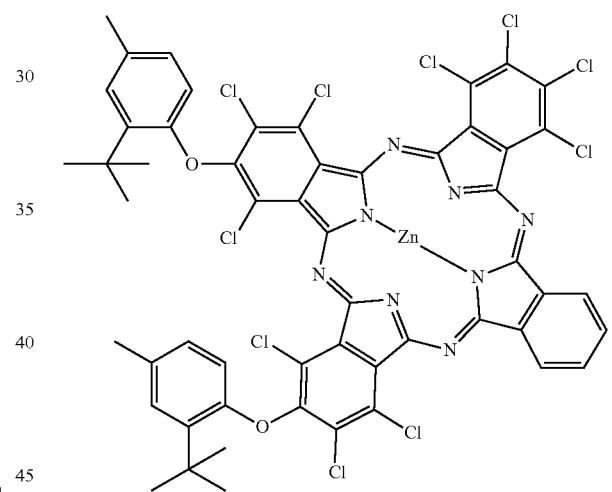
[Chemical Formula 1-11]
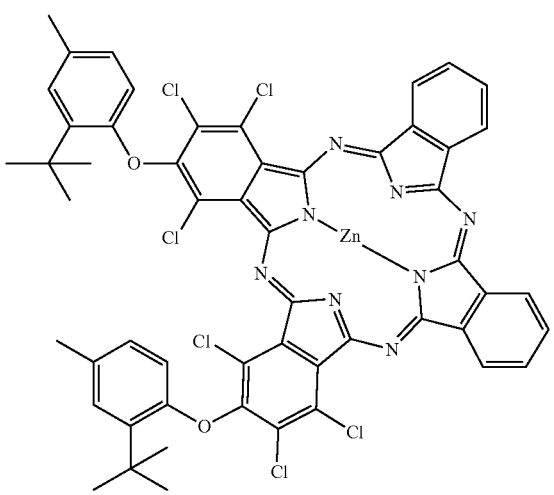

[Chemical Formula 1-12]
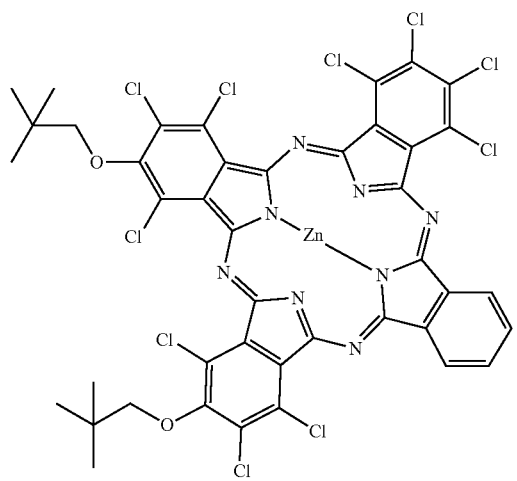
[Chemical Formula 1-15]
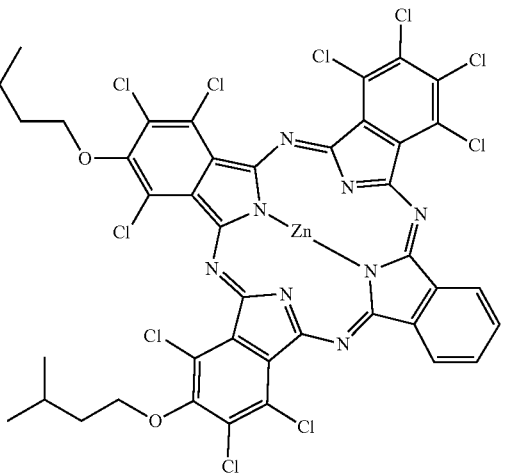
[Chemical Formula 1-13]
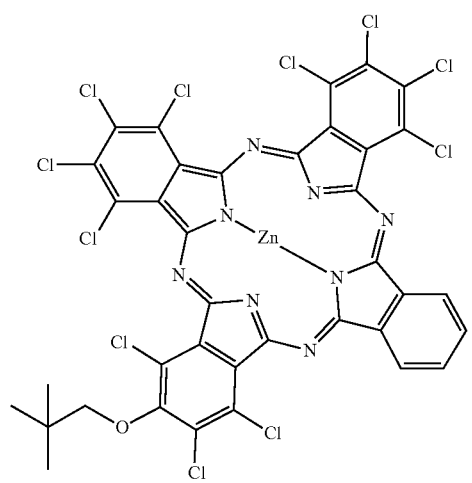
[Chemical Formula 1-16]
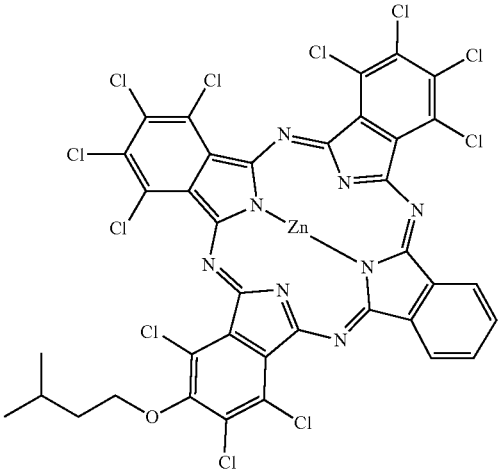
[Chemical Formula 1-14]
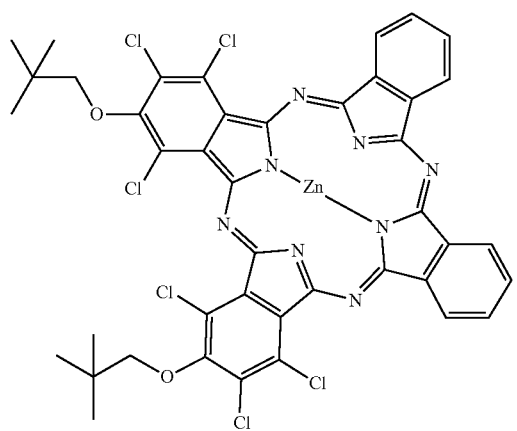
[Chemical Formula 1-17]
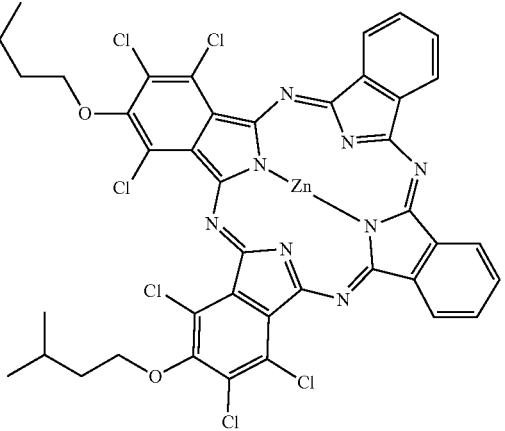

[Chemical Formula 1-18]

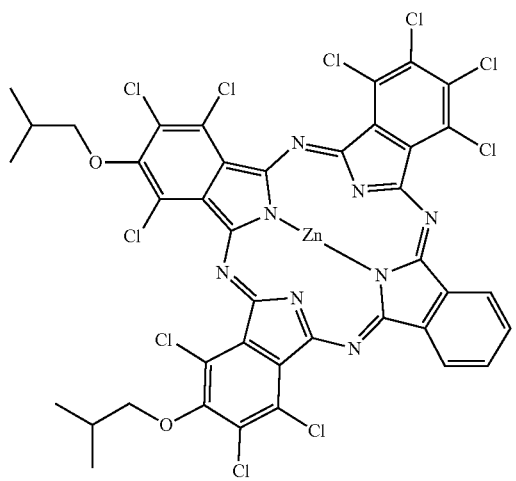

[Chemical Formula 1-19]

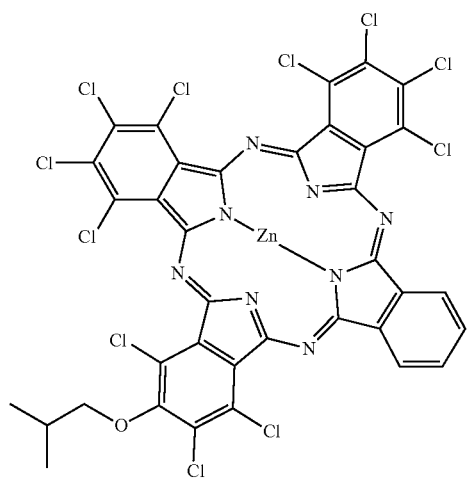

[Chemical Formula 1-20]

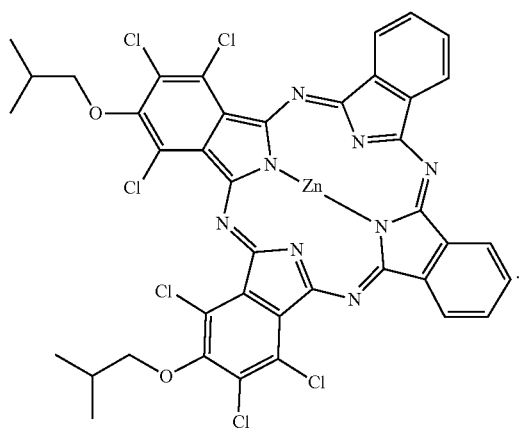

10. The compound as claimed in claim 1, wherein the compound is a green dye.

11. A photosensitive resin composition comprising the compound as claimed in claim 1.

12. The photosensitive resin composition as claimed in claim 11, wherein the compound is included in an amount of about 1 wt % to about 40 wt %, based on a total weight of the photosensitive resin composition.

13. The photosensitive resin composition as claimed in claim 11, further comprising a binder resin, a photopolymerizable compound, a photopolymerization initiator, and a solvent.

14. The photosensitive resin composition as claimed in claim 13, further comprising a pigment.

15. The photosensitive resin composition as claimed in claim 13, further comprising a compound represented by Chemical Formula 3:

[Chemical Formula 3]

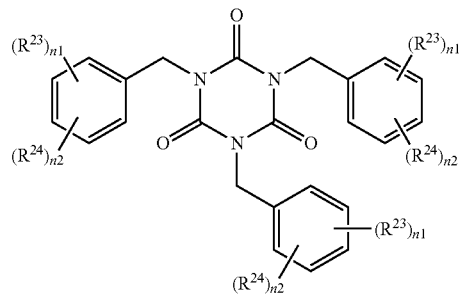

wherein, in Chemical Formula 3,
$R^{23}$ and $R^{24}$ are each independently a hydroxy group or a substituted or unsubstituted C1 to C20 alkyl group, and
n1 and n2 are each independently an integer of 0 to 5, provided that $3 \leq n1+n2 \leq 5$.

16. A photosensitive resin layer produced using the photosensitive resin composition as claimed in claim 11.

17. A color filter comprising the photosensitive resin layer as claimed in claim 16.

18. A display device comprising the color filter as claimed in claim 17.

* * * * *